(12) United States Patent
Liu et al.

(10) Patent No.: US 10,020,054 B2
(45) Date of Patent: Jul. 10, 2018

(54) MEMRISTOR-BASED PROCESSOR INTEGRATING COMPUTING AND MEMORY AND METHOD FOR USING THE PROCESSOR

(71) Applicant: HUAZHONG UNIVERSITY OF SCIENCE AND TECHNOLOGY, Wuhan (CN)

(72) Inventors: Qun Liu, Wuhan (CN); Tao Zhang, Wuhan (CN); Xiangshui Miao, Wuhan (CN); Yi Li, Wuhan (CN); Yaxiong Zhou, Wuhan (CN); Tianpeng Miao, Wuhan (CN)

(73) Assignee: HUAZHONG UNIVERSITY OF SCIENCE AND TECHNOLOGY, Wuhan (CN)

( * ) Notice: Subject to any disclaimer, the term of this patent is extended or adjusted under 35 U.S.C. 154(b) by 0 days.

(21) Appl. No.: 15/629,714

(22) Filed: Jun. 21, 2017

(65) Prior Publication Data
US 2017/0287558 A1 Oct. 5, 2017

Related U.S. Application Data

(63) Continuation-in-part of application No. PCT/CN2015/070572, filed on Jan. 13, 2015.

(30) Foreign Application Priority Data

Dec. 22, 2014 (CN) .......................... 2014 1 0803340

(51) Int. Cl.
*G06F 12/0813* (2016.01)
*G11C 13/00* (2006.01)

(52) U.S. Cl.
CPC ...... *G11C 13/0069* (2013.01); *G11C 13/0097* (2013.01)

(58) Field of Classification Search
CPC .................................................. G06F 12/0813
(Continued)

(56) References Cited

U.S. PATENT DOCUMENTS

| 5,469,003 A * | 11/1995 | Kean | .................. G06F 17/5054 |
| | | | 326/38 |
| 7,581,083 B2 * | 8/2009 | Shiga | ........................ G06F 9/35 |
| | | | 710/1 |

(Continued)

*Primary Examiner* — Min Huang
(74) *Attorney, Agent, or Firm* — Matthias Scholl, PC; Matthias Scholl

(57) ABSTRACT

A processor including a computing and memory structure including X in number integration units and X in number communication units, and a control unit. The integration units are computing and memory units (CMUs), each computing and memory unit (CMU) is connected to a corresponding communication unit. The control unit is configured to produce control signals according to the commands, connect communication networks between the CMUs, choose operand addresses and result storage addresses, and search for one or a plurality of idle CMUs when extra CMUs are required for an operation. Each computing and memory unit includes M in number bit units and M−1 in number vertical line switches. Each bit unit includes a resistor, a horizontal line switch and N in number memristors. X is a positive integer greater than or equal to 2; M is a positive integer greater than or equal to 1.

16 Claims, 6 Drawing Sheets

(58) Field of Classification Search
USPC .................................... 711/E12.017; 365/63
See application file for complete search history.

(56) References Cited

U.S. PATENT DOCUMENTS

| | | | | |
|---|---|---|---|---|
| 2014/0071749 | A1* | 3/2014 | Ishiguro ............. | G11C 13/0004 365/163 |
| 2015/0095860 | A1* | 4/2015 | Satou ................. | G06F 17/5077 716/103 |
| 2015/0280717 | A1* | 10/2015 | Sato ................... | H03K 19/1776 326/41 |
| 2016/0170936 | A1* | 6/2016 | Sun ........................ | G06F 7/785 711/154 |
| 2018/0067786 | A1* | 3/2018 | Nguyen Trung ....... | G06F 9/544 |

* cited by examiner

MEMRISTOR-BASED PROCESSOR INTEGRATING COMPUTING AND MEMORY AND METHOD FOR USING THE PROCESSOR

CROSS-REFERENCE TO RELATED APPLICATIONS

This application is a continuation-in-part of International Patent Application No. PCT/CN2015/070572 with an international filing date of Jan. 13, 2015, designating the United States, now pending, and further claims priority benefits to Chinese Patent Application No. 201410803340.8 filed Dec. 22, 2014. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND OF THE INVENTION

Field of the Invention

The invention belongs to the field of microelectronic devices, and in particular to a processor integrating memristor-based computing and memory and to a method for using the processor.

Description of the Related Art

Traditional computers adopt the von Neumann architecture. The storage and computing units of the von Neumann architecture are separated from each other and respectively completed by arithmetical units in memories and central processing units (processors). As the semiconductor technology improves constantly, the performance of processors and memories has improved greatly. According to the Moore's Law, the number of the transistors in a microprocessor doubles every 18 months; and the annual growth rate of processor performance once exceeded 50% but the average annual growth rate of memory performance is just 7% and doubles about every ten years. Let's take Intel processors as an example. From 1980 to 2006, the clock rate of processors increased by about 3500 times but the access time of DRAM only decreased by about 6 times. Since the growth rates of storage technology and processor technology are imbalanced, the gap between the two growth rates keeps growing larger. Therefore, it takes a quite long time for processors to read stored data, which causes the problem of Memory Wall. This problem has become a bottleneck that prevents the further improvement of the overall performance of computer systems.

The performance difference between processors and memories is a problem that can't be solved in a short time. To reduce the influence of storage and access on processor performance is one of the main challenges in current processor architecture design. As the integrated level of single chip transistors becomes higher and higher, the problems such as power consumption, line transmission delay and leakage current get worse increasingly. It has already become very difficult to improve processor performance only by improving basic frequency. However, the return on investment of the instruction-level parallelism adopting the traditional superscale and speculative technological development becomes lower and lower. Therefore, the development of higher-level thread-level parallelism and task parallelism has become the inevitable trend in constantly improving processor performance; and the advanced architecture represented by multi-core processors has become the main trend of the processor development. The multi-core design is the dominant idea in the current high-performance computing field and has been used in many fields such as servers, laptops, game platforms and high-performance multi-media applications. The on-chip multi-core architecture which integrates multi-microprocessor cores into a chip and the multi-core and multi-threaded architecture which adopts the multi-threaded technology both effectively utilize on-chip transistor resources and provide users with multi-threaded execution capacity and high productivity computation. The multi-core architecture is an effective way to further improve processor performance while complying with the Moore's Law and utilizing the limited chip area. How to carry out and further optimize the multi-core design has become the key point of research in the academic and industrial circles recently.

The memory of a traditional single-processor chip only needs to provide data for one processor. However, as for a multi-core chip, its memory needs to provide data for multiple processor cores. At present, according to the Moore's Law, the number of the cores of a multi-core processor increases but the memory bandwidth of the processor is subject to the number of chip pins and almost doesn't increase. Moreover, the mutual access interference between threads of the multi-core processor further leads to the increase of access request delay. These changes worsen the current Memory Wall problem. When the memory bandwidth remains the same, the scale of problem increases with time, and the program execution time also increases exponentially with time. Therefore, in the predictable future, the storage system will still be the largest problem for computer system designers.

As for this problem, we hope that we solve this problem by changing computer hardware. Memristors are the next generation of nonvolatile memories. A memristor can realize reversible transformations between high resistance and low resistance under electric pulses. High resistance and low resistance can be used to represent and store "0" and "1". High resistance represents "0" and low resistance represents "1". This is different from the traditional "electrical level" logic. The traditional "electrical level" logic uses high and low voltages to represent "0" and "1", by which circuit states can't be stored after power failure. In order to guarantee nonvolatile storage, a storage state needs to be adopted. The state we adopt is the state of resistance. Therefore, since we consider that the resistance property of memristors participates in the completion of logic computation and the resistance states of memristors are used to store computation results when we design circuits, information can still be stored when the power is cut off. Therefore, the step that the traditional architecture outputs the computation results to memories is omitted, and the integration of Computing and Memory is realized.

In 2010, HP Labs published an article in the journal Nature and put forward that the future nonvolatile logical operation of states will replace the existing logical operation of electrical level. It uses two memristors and one resistance to realize the (NOT p) OR q logic of Material Implication (IMP). Logic states are all stored in memristors in the form of resistance in a nonvolatile way. The integration of storage and computation is realized in memristors for the first time.

Implication operation needs to use a resistor $R_G$ ($R_{ON} \ll R_G \ll R_{OFF}$) which is connected to two memristors P and Q in parallel. The initial values of p and q are stored in the memristors P and Q. The voltages $V_{COND}$ and $V_{SET}$ are applied to P and Q respectively. The $V_{COND}$ applied to P is less than the threshold voltage so the state of P won't be changed. When P is in a state of high resistance (logic 0), since $R_{OFF} \gg R_G$, the voltage of $R_G$ is almost equal to 0. Therefore, the voltages of the two ends of Q are $V_Q \approx V_{SET}$. At the moment, no matter what state Q was in before, Q will be in a state of low resistance (logic 1). When the state of P is in a state of low resistance (logic 1), since $R_G \gg R_{ON}$, the voltage of $R_G$ is almost equal to $V_{COND}$. Therefore, the voltages of the two ends of Q is $V_Q \approx V_{SET} - V_{COND}$ which is less than the threshold voltage and won't change the state of the memristors. Therefore, Q remains the original state. In other words, that is q'←pIMPq as shown in FIGS. 1A and 1B.

There are two main technical ways to solve the Memory Wall problem. The first way is to improve memory performance fundamentally but likely there will be no effective techniques and means to improve memory performance in a short time. The second way is to rely on the rapid development of micro-electronic technology, change computer architecture and optimize computer hardware to solve the Memory Wall problem.

SUMMARY OF THE INVENTION

In order to solve defects in the prior art, the invention aims to provide a memristor-based processor for realizing computing and memory integration and method for using the processor so as to solve the problem of frequently reading and writing data in memories during computation.

The invention provides a memristor-based processor for realizing computing and memory integration, and comprises a computing and memory structure and a control unit. The computing and memory structure comprises X in number integration units and X in number communication units. Every integration unit is connected to a communication unit. All communication units are connected to each other to form a communication network. the control unit is configured to produce corresponding control signals according to commands, connect communication networks between CMUs, and choose operand addresses and result storage addresses. When other CMUs need to be used during operation, the control unit can search for one or a plurality of idle CMUs to realize the operation. Among them, an integration unit comprises M in number bit units and M−1 in number vertical line switches. M in number bit lines of M in number bit units are all connected to a communication unit. A vertical line switch, if exists, is arranged between the bit line ends of two adjacent bit units. A bit unit comprises a resistor, a horizontal line switch and N in number memristors. One end of the first memristor serves as the first selection line and the other end of the first memristor is grounded by horizontal line switches and resistors in series. One end of the second memristor serves as the second selection line and the other end of the second memristor is connected to the other end of the first memristor. One end of the third memristor serves as the third selection line and the other end of the third memristor is connected to the other end of the second memristor . . . . One end of the $N^{th}$ memristor serves as the $N^{th}$ selection line and the other end of the $N^{th}$ memristor is connected to the other end of the $N-1^{th}$ memristor. X is a positive integer greater than or equal to 2. M is a positive integer greater than or equal to 2. N is a positive integer greater than or equal to 2.

Furthermore, the resistance value of the resistor in a bit unit is far greater than the resistance value of memristors in a low-resistance state and far less than the resistance value of memristors in a high-resistance state.

Furthermore, the resistance value of the resistor is the square root of the product of the resistance value of memristors in a high-resistance state and the resistance value of memristors in a low-resistance state The invention also provides an operation method for data transmission, arithmetical operation, logical operation and shifting on the basis of the processor. The data transmission operation comprises the following steps:

(1.1) The first voltage $V_{CLEAR}$ is applied to the selection lines of the first set of memristors $B_1$ and the second set of memristors $B_2$ in the second integration unit B-CMU simultaneously. Therefore, the first set of memristors $B_1$ and the second set of memristors $B_2$ are both in a state of high resistance. The state of high resistance is marked as 0.

The first voltage $V_{CLEAR}$ is negative and greater than a threshold voltage. The threshold voltage is the voltage which changes the state of the memristors.

(1.2) Through a communication network, the first integration unit A-CMU and the second integration unit B-CMU are connected. ((NOT $A_1$) OR $B_2$) is stored in $B_2$ to realize implication operation by applying the second voltage $V_{COND}$ to the selection line of the first set of memristors $A_1$ in the first integration unit A-CMU and applying the third voltage $V_{SET}$ to the selection line of the second set of memristors $B_2$ in the second integration unit B-CMU.

Among them, the second voltage $V_{COND}$ is positive and less than a threshold voltage; the third voltage $V_{COND}$ is positive and greater than a threshold voltage; and the difference between the third voltage $V_{COND\ and}$ the second voltage $V_{COND}$ is less than the threshold voltage.

(1.3) The second voltage $V_{COND}$ is applied to the selection line of the second set of memristors $B_2$ in the second integration unit B-CMU; and the third voltage $V_{SET}$ is applied to the first set of memristors $B_1$ in the second integration unit B-CMU. Data are stored in $B_1$ to realize implication operation $B_1 \leftarrow B_2$ IMP $B_1$ so as to transmit data X in the first set of memristors $A_1$ in the first integration unit A-CMU into the first set of memristors $B_1$ in the second integration unit B-CMU.

The invention comprises a plurality of computing and memory units which are connected by a communication network. At present, memories which are connected to processors all use high and low electrical levels to represent "0" and "1" and the circuit state can't be stored after power failure. In order to guarantee nonvolatile storage, state storage needs to be adopted. The invention adopts the state of resistance. Since the invention considers that the resistance property of memristors participates in the completion of corresponding computation and resistance states of memristors are used to store computing results when circuits are designed, the step that the traditional architecture outputs the computing results to memories is omitted, and the integration of computing and memory is realized. Through the communication network, data in any CMUs can serve as operands for computation and be stored in a designated CMU. CMUs can be used to store data and can also be used as a computing unit, which is different from current computer systems which must use dedicated arithmetic units and memories. It is very convenient for the invention to carry out parallel computation and parallel storage and realize most computing and memory operations of the current computer systems.

DETAILED DESCRIPTION OF THE EMBODIMENTS

Figures 1A, 1B:
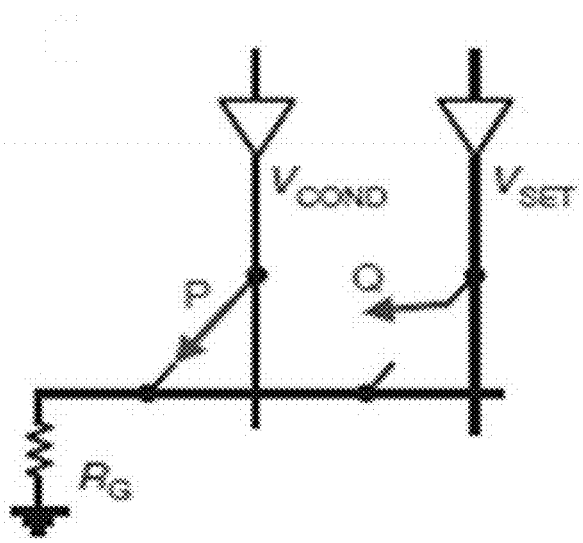
FIG. 1A is an implication operation circuit and FIG. 1B is an implication operation p IMP q truth table.

In order to make the aim, technical proposals and advantages of the invention clearer, the invention is further explained in detail by combining with figures and embodiments as follows. It should be understood that the embodiments are provided for illustration only, and not for the purpose of limiting the invention.

Memristors of prior art are used for computation, how to get data for computation is not explained and computing results are always stored in an adjacent unit. Therefore, it is more difficult to operate the computing results next time. The invention discloses a plan for realizing a set of memristor-based nonvolatile data transmission, arithmetical operation, logical operation and shifting. The invention also discloses processor array architecture of computing and memory integration. Since the invention has computing and memory functions, the invention can be used for other units which need computing and memory functions such as Graphic Processing Units (GPU) and routers.

In an embodiment of the invention, memristor-based processor architecture for realizing computing and memory integration comprises a computing and memory structure and a control unit. The computing and memory structure comprises X in number integration units and X in number communication units. Every integration unit is connected to a communication unit. All communication units are connected to each other to form a communication network. X is a positive integer greater than or equal to 2. The control unit is configured to produce corresponding control signals according to commands, connect communication networks between CMUs, and choose operand addresses and result storage addresses. When other CMUs need to be used during operation, the control unit can search for one or a plurality of idle CMUs to realize the operation.

Among them, the integration units refer to computing and memory units (CMU). When a single command is executed in X CMUs, Y CMUs are connected to each other through a communication network. After execution, results are stored in any one of Y CMUs. Among them, X≥Y>0.

Among them, an integration unit comprises M in number bit units and M−1 in number vertical line switches. M in number bit units and M in number bit lines are all connected to a communication unit. A vertical line switch, if exists, is arranged between the bit line ends of two adjacent bit units. M is a positive integer greater than or equal to 1.

A bit unit comprises a resistor, a horizontal line switch and N in number memristors. One end of the first memristor serves as the first selection line and the other end of the first memristor is grounded by horizontal line switches and resistors in series. One end of the second memristor serves as the second selection line and the other end of the second memristor is connected to the other end of the first memristor. One end of the third memristor serves as the third selection line and the other end of the third memristor is connected to the other end of the second memristor . . . . One end of the $N^{th}$ memristor serves as the $N^{th}$ selection line and the other end of the $N^{th}$ memristor is connected to the other end of the N−$1^{th}$ memristor. N is a positive integer greater than or equal to 1.

As one embodiment of the invention, the resistance value of the resistance is far greater than the resistance value of memristors in a low-resistance state and far less than the resistance value of memristors in a high-resistance state. The resistance value of the resistor is the square root of the product of the resistance value of memristors in a high-resistance state and the resistance value of memristors in a low-resistance state.

In a computing and memory unit of the memristor-based new processor, a bit unit structure comprises the first memristor, the second memristor, the third memristor . . . the $N^{th}$ memristor, the first selection line, the second selection line, the third selection line . . . the $N^{th}$ selection line, 1 bit line, 1 horizontal line switch and 1 resistor, in which N≥1. When N=1, a single CMU can't conduct implication operation. When N=2, a single CMU can conduct implication operation. The greater the N is, the more operations a single CMU can conduct.

The input end of the first memristor serves as the input end of the first selection line of the circuit. The input end of the second memristor serves as the input end of the second selection line of the circuit. The input end of the third memristor serves as the input end of the third selection line of the circuit . . . . The input end of the $N^{th}$ memristor serves as the input end of the $N^{th}$ selection line of the circuit. The other ends of the first memristor, the second memristor, the third memristor . . . the $N^{th}$ memristor are connected to the bit line and one side of the horizontal line switch. The other side of the horizontal line switch is connected to the resistor in series. The other side of the resistor is grounded.

The CMU structure is designed by M bits, and comprises M in number bit units and M−1 in number vertical line switches. The first memristors of M in number bit units constitute the first set of memristors. The second memristors of M in number bit units constitute the second set of memristors. The third memristors of M in number bit units constitute the third set of memristors . . . . The $N^{th}$ memristors of M in number bit units constitute the $N^{th}$ set of memristors. Every set has M memristors, and M≥1. When the total numbers of memristors are the same and Ms are the same, the greater N is, the less the number of CMUs is and the less the network expense is.

The selection lines of the first set of memristors are connected to each other and constitute the first set of selection lines. The selection lines of the second set of memristors are connected to each other and constitute the second set of selection lines. The selection lines of the third set of memristors are connected to each other and constitute the third set of selection lines . . . . The selection lines of the $N^{th}$ set of memristors are connected to each other and constitute the $N^{th}$ set of selection lines. Through a set of selection lines, one or a plurality of memristors can be chosen in the set of selection lines. If there are M in number bit lines, the two adjacent bit lines are connected through a vertical line switch. A first vertical line switch is arranged between the first bit line and the second bit line; a second vertical line switch is arranged between the second bit line and the third bit line; and the rest may be deduced by analogy.

The new processor structure of computing and memory integration is characterized in that the processor structure comprises X in number communication units, every communication unit is connected to a CMU and all CMUs are connected through a communication network. When CMUs are connected in pairs, the connection is characterized in that, according to control signals, the first bit line of A-CMU can be connected to the first bit line of B-CMU, the second bit line of A-CMU can be connected to the second bit line of B-CMU . . . the $M^{th}$ bit line of A-CMU can be connected to the $M^{th}$ bit line of B-CMU. A-CMU and B-CMU can also be connected in a single bit or multi-bit staggered way. For example, the first to M−1 bit lines of A-CMU are connected to the second to the $M^{th}$ bit lines of B-CMU, or the third to M in number bit lines of A-CMU are connected to the first to the M−$2^{th}$ bit lines of B-CMU.

Data of every memristor has a fixed address. First the CMU of the memristor is chosen and then the memristor is found out through a selection line in the CMU.

The selection line can choose a specific or a plurality of specific memristors of the data.

The selection line chooses one or a plurality of memristors which need to write "1" and the third voltage $V_{SET}$ is applied to the selection line. Then the selection line chooses one or a plurality of memristors which need to write "0" and the voltage $V_{CLEAR}$ is applied to the selection line.

Figure 2:
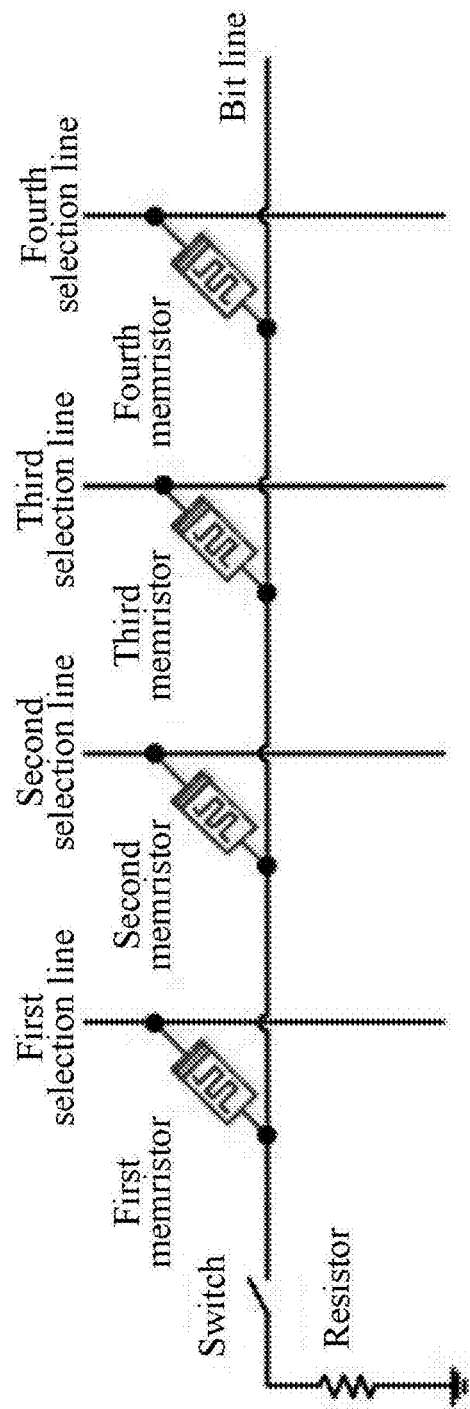
FIG. 2 is a bit unit of N=4.
Figure 3:
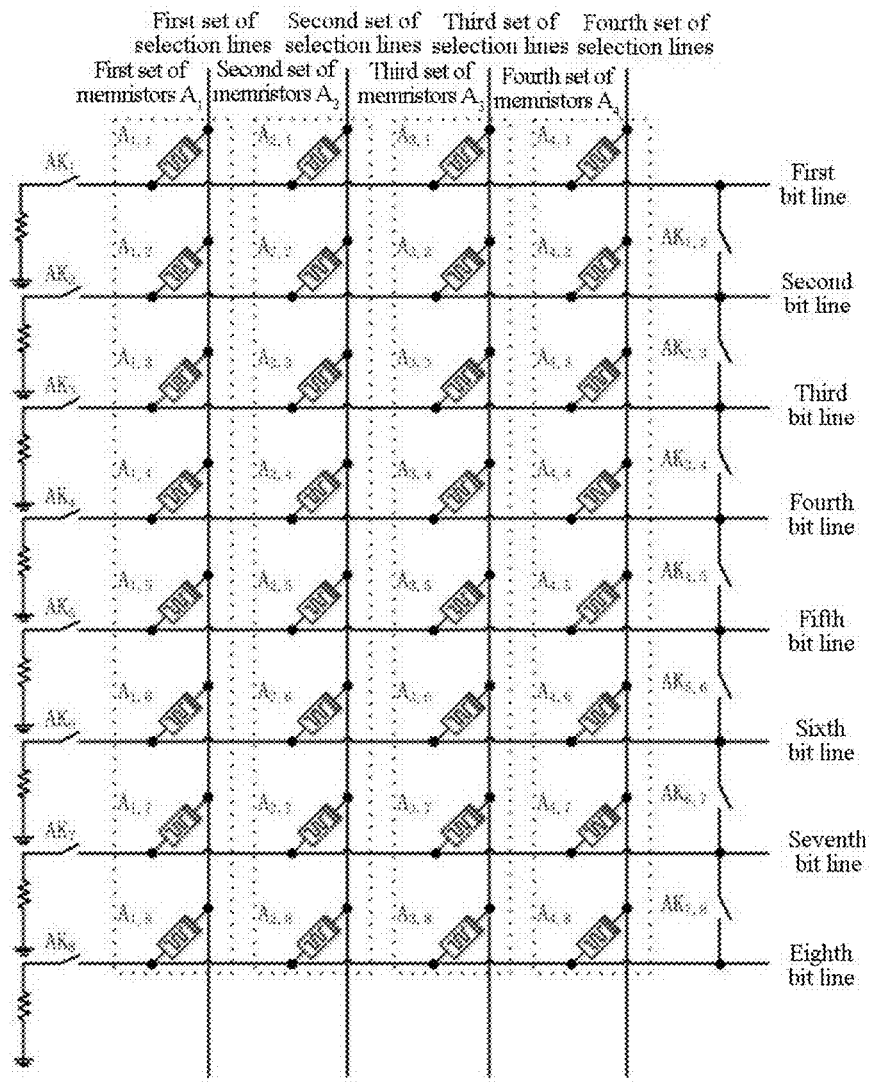
FIG. 3 is a CMU of M=8, N=4.
Figure 4:
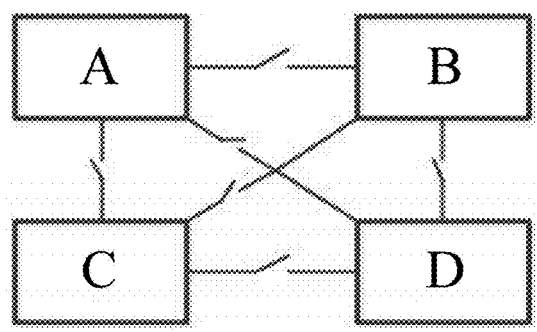
FIG. 4 is a logical structure diagram of a summator in a processor of M=8, N=4
Figure 5:
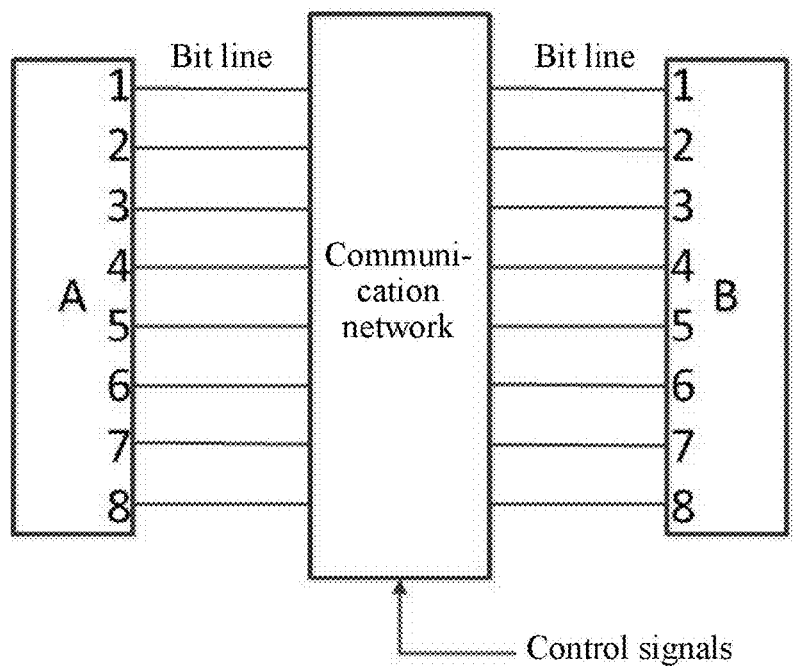
FIG. 5 is a logical structure of M=8 connecting A-CMU with B-CMU.
Figure 6:
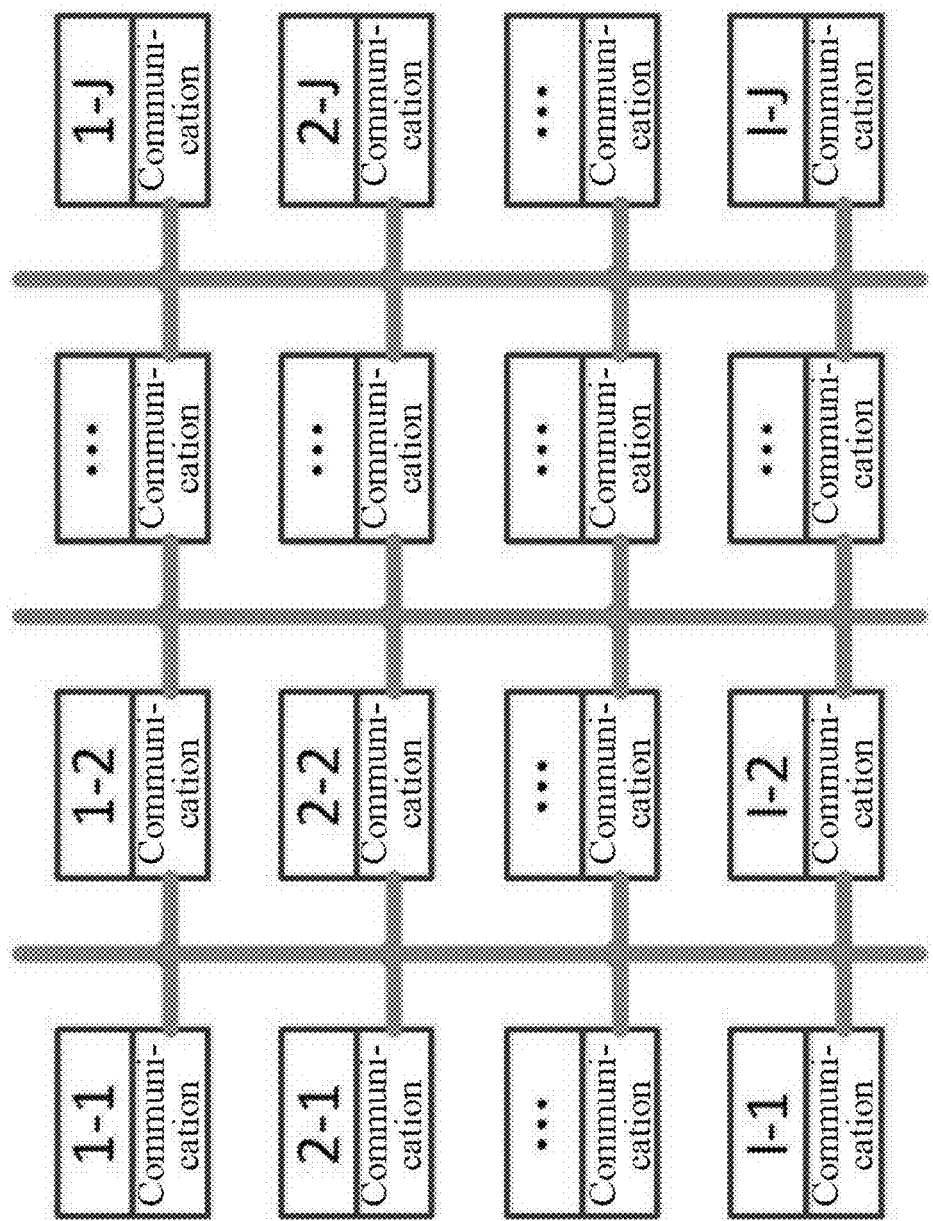
FIG. 6 is a computing and memory structure.
Figure 7:
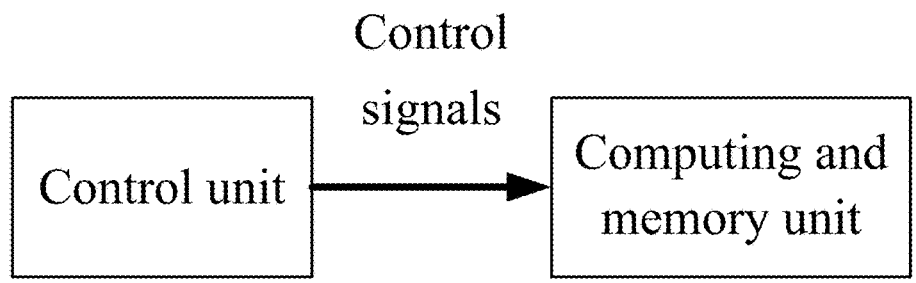
FIG. 7 is a processor structure of computing and memory integration.
Figure 8:
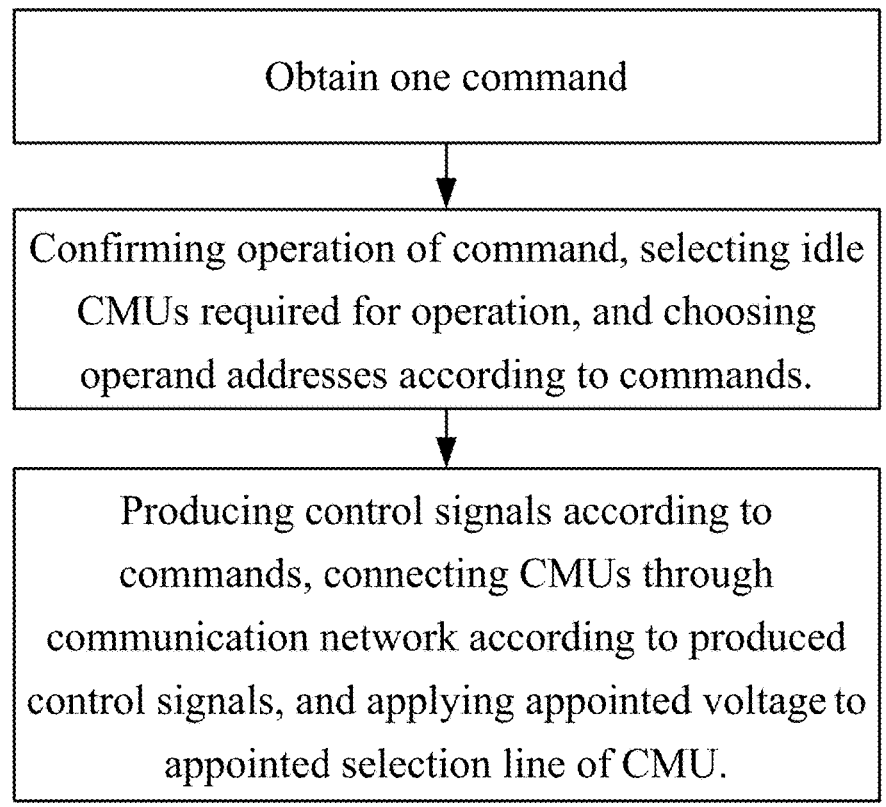
FIG. 8 is a control flow of a control unit.

In an embodiment of the invention, as for a computing and memory unit, when N=4, bit units are shown in FIG. 2; when M=8, every byte of data uses a selection line to choose the byte of data; a byte of data is represented by 8 memristors; and every memristor represents a bit of data. A full adder comprises 4 CMUs which are connected in pairs through a communication network, and the specific structure is shown in FIGS. 3, 4 and 5. The structural design of computing and memory units is shown in FIG. 6. The new processor structure of computing and memory integration is shown in FIG. 7, and can determine the CMU position of data storage by the control unit and then the specific data position through selection lines. The flow diagram of the control unit is shown in FIG. 8.

1. When N is less than 4, M is any positive integer and the specific operation methods are the same. In order to explain the invention more easily, now N=2, M=8 is taken as an example for detailed explanations as follows:

The first integration unit A-CMU comprises 8 bit units. A bit unit comprises 2 memristors. The first memristors of the 8 bit units constitute the first set of memristors $A_1$. The first memristors of the first set of memristors $A_1$ are respectively marked as: $A_{1,1}, A_{1,2}, A_{1,3}, A_{1,4}, A_{1,5}, A_{1,6}, A_{1,7}$ and $A_{1,8}$. The second memristors of the 8 bit units constitute the second set of memristors $A_2$. The second memristors of the second set of memristors $A_2$ are respectively marked as: $A_{2,1}, A_{2,2}, A_{2,3}, A_{2,4}, A_{2,5}, A_{2,6}, A_{2,7}$ and $A_{2,8}$.

The second integration unit B-CMU comprises 8 bit units. A bit unit comprises 2 memristors. The first memristors of the 8 bit units constitute the first set of memristors. The first memristors of the first set of memristors are respectively marked as: $B_{1,1}, B_{1,2}, B_{1,3}, B_{1,4}, B_{1,5}, B_{1,6}, B_{1,7}$ and $B_{1,8}$. The second memristors of the 8 bit units constitute the second set of memristors. The second memristors of the second set of memristors are respectively marked as: $B_{2,1}, B_{2,2}, B_{2,3}, B_{2,4}, B_{2,5}, B_{2,6}, B_{2,7}$ and $B_{2,8}$.

In the same way, the third integration unit C-CMU, the fourth integration unit D-CMU, the fifth integration unit E-CMU, the sixth integration unit F-CMU, the seventh integration unit G-CMU and the eighth integration unit H-CMU are all comprised of 8 bit units. A bit unit comprises 2 memristors. The first memristors of the 8 bit units constitute the first sets of memristors which are $C_1, D_1, E_1, F_1, G_1$ and $H_1$ respectively. The second memristors of the 8 bit units constitute the second sets of memristors which are $C_2, D_2, E_2, F_2, G_2$ and $H_2$ respectively.

(1) Data Transmission

Data x is stored in the first set of memristors $A_1$ in the first integration unit A-CMU. The processor is adopted to transmit the data X to the first set of memristors $B_1$ in the second integration unit B-CMU. The specific operating methods are as follows:

(1.1) The first voltage $V_{CLEAR}$ is applied to the selection lines of the first and second sets of memristors $B_1$ and $B_2$ in the second integration unit B-CMU. Therefore, the memristors are in a state of high resistance, and the state of high resistance is marked as 0. The voltage $V_{CLEAR}$ is negative and greater than the first threshold voltage. The first threshold voltage is the voltage that changes the state of memristors. The first threshold voltage is a given value.

(1.2) Through a communication network, A-CMU and B-CMU are connected. The second voltage $V_{COND}$ is applied to the selection line of the first set of memristors $A_1$ of the first integration unit A-CMU, and the third voltage $V_{SET}$ is applied to the selection line of the second set of memristors $B_2$ of the second integration unit B-CMU. Therefore, implication operation is realized to store ((NOT $A_1$) OR $B_2$) in $B_2$. That is $B_2 \leftarrow A_1$ IMP $B_2$. The second voltage $V_{COND}$ is positive and less than the threshold voltage. The third voltage $V_{SET}$ is positive and greater than the threshold voltage.

(1.3) The second voltage $V_{COND}$ is applied to the selection line of the second set of memristors $B_2$ of the second integration unit B-CMU, and the third voltage $V_{SET}$ is applied to the first set of memristors $B_1$ of the second integration unit B-CMU. Therefore, implication operation of $B_1 \leftarrow B_2$ IMP $B_1$ is realized to store data in $B_1$.

Compared to data transmission operation of current computers, data transmission operation of the invention doesn't need arithmetic units. Meanwhile, the invention can conduct a plurality of other operations and is better in parallelism.

(2) Data Exchange

Data x is stored in $A_1$ of A-CMU. Data y is stored in $B_1$ of B-CMU. The processor is adopted to exchange positions of data x and data y. The specific operation method is as follows:

(2.1) The first voltage $V_{CLEAR}$ is applied to the selection lines of $C_1, C_2, D_1$ and $D_2$. Therefore, $C_1, C_2, D_1$ and $D_2$ are in a state of high resistance and the state of high resistance is marked as 0.

(2.2) Through a communication network, A-CMU and C-CMU are connected, and B-CMU and D-CMU are connected. The second voltage $V_{COND}$ is applied to the selection lines of $A_1$ and $B_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $C_2 \leftarrow A_1$ IMP $C_2$ and $D_2 \leftarrow B_1$ IMP $D_2$ is realized.

(2.3) The second voltage $V_{COND}$ is applied to the selection lines of a second set of memristors $C_2$ of the third integration unit C-CMU and a second set of memristors $D_2$ of the fourth integration unit D-CMU simultaneously, and the third voltage $V_{SET}$ is applied to the a first set of memristors $C_1$ of the third integration unit C-CMU and a first set of memristors D1 of the fourth integration unit D-CMU simultaneously. Therefore, the implication operation of $C_1 \leftarrow C_2$ IMP $C_1$ and $D_1 \leftarrow D_2$ IMP $D_1$ is realized.

(2.4) The first voltage $V_{CLEAR}$ is applied to the selection lines of $A_1, A_2, B_1$ and $B_2$ simultaneously. Therefore, $A_1, A_2, B_1$ and $B_2$ are in a state of high resistance.

(2.5) Through a communication network, A-CMU and D-CMU are connected, and B-CMU and C-CMU are connected. The second voltage $V_{COND}$ is applied to the a first set of memristors $C_1$ of the third integration unit C-CMU and a first set of memristors D1 of the fourth integration unit D-CMU simultaneously, and the third voltage $V_{SET}$ is applied to the selection lines of $A_2$ and $B_2$ simultaneously. Therefore, the implication operation of $A_2 \leftarrow D_1$ IMP $A_2$ and $B_2 \leftarrow C_1$ IMP $B_2$ is realized.

(2.6) The second voltage $V_{COND}$ is applied to the selection lines of $A_2$ and $B_2$ simultaneously, and the third voltage $V_{SET}$ is applied to the selection lines of $A_1$ and $B_1$ simultaneously. Therefore, the implication operation of $A_1 \leftarrow A_2$ IMP $A_1$ and $B_1 \leftarrow B_2$ IMP $B_1$ is realized, data x is stored in $B_1$ of B-CMU and data y is stored in $A_1$ of A-CMU.

Compared to data transmission operation of current computers, data transmission operation of the invention doesn't need arithmetic units. Meanwhile, the invention can conduct a plurality of other operations and is better in parallelism.

(3) Addition

Data x is stored in $A_1$ of A-CMU. Data y is stored in $B_1$ of B-CMU. The processor is adopted to add data x to data y and then store the result in $C_1$ of C-CMU. The specific operation method is as follows:

(3.1) The first voltage $V_{CLEAR}$ is applied to the selection lines of $C_2$, $G_1$, $G_2$, $D_2$ and $H_1$. Therefore, $C_2$, $G_1$, $G_2$, $D_2$ and $H_1$ are in a state of high resistance.

(3.2) Through a communication network, A-CMU and G-CMU are connected, and B-CMU and H-CMU are connected. The second voltage $V_{COND}$ is applied to the selection lines of $A_1$ and $B_1$ simultaneously, and the third voltage $V_{SET}$ is applied to the selection lines of $G_1$ and $H_1$ simultaneously. Therefore, the implication operation of $G_1 \leftarrow A_1$ IMP $G_1$ and $H_1 \leftarrow B_1$ IMP $H_1$ is realized.

(3.3) Through a communication network, C-CMU and G-CMU are connected, and D-CMU and H-CMU are connected. The second voltage $V_{COND}$ is applied to the selection lines of $G_1$ and $H_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $C_2 \leftarrow G_1$ IMP $C_2$ and $D_2 \leftarrow H_1$ IMP $D_2$ is realized.

(3.4) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $D_2 \leftarrow A_1$ IMP $D_2$ and $C_2 \leftarrow B_1$ IMP $C_2$ is realized.

(3.5) Through a communication network, C-CMU and G-CMU are connected. The second voltage $V_{COND}$ is applied to the selection line of $C_2$, and the third voltage $V_{SET}$ is applied to the selection line of $G_2$. Therefore, the implication operation of $G_2 \leftarrow C_2$ IMP $G_2$ is realized.

(3.6) Through a communication network, D-CMU and G-CMU are connected. The second voltage $V_{COND}$ is applied to the selection line of $D_2$, and the third voltage $V_{SET}$ is applied to the selection line of $G_2$. Therefore, the implication operation of $G_2 \leftarrow D_2$ IMP $G_2$ is realized.

(3.7) The first voltage $V_{CLEAR}$ is applied to the selection lines of $B_{2,i}$, $D_{2,i}$ and $H_{2,i+1}$ simultaneously. Therefore, $B_{2,i}$, $D_{2,i}$ and $H_{2,i+1}$ are in a state of high resistance. (Initial i=1)

(3.8) Through a communication network, D-CMU and G-CMU are connected. The second voltage $V_{COND}$ is applied to the selection lines of $B_{1,i}$ and $G_{2,i}$, and the third voltage $V_{SET}$ is applied to the selection lines of $B_{2,i}$ and $D_{2,i}$. Therefore, the implication operation of $B_{2,i} \leftarrow B_{1,i}$ IMP $B_{2,i}$ and $D_{2,i} \leftarrow G_{2,i}$ IMP $D_{2,i}$ is realized.

(3.9) Through a communication network, A-CMU and B-CMU are connected, and D-CMU and H-CMU are connected. The second voltage $V_{COND}$ is applied to the selection lines of $A_{1,i}$ and $H_{2,i}$, and the third voltage $V_{SET}$ is applied to the selection lines of $B_{2,i}$ and $D_{2,i}$. Therefore, the implication operation of $B_{2,i} \leftarrow A_{1,i}$ IMP $B_{2,i}$ and $D_{2,i} \leftarrow H_{2,i}$ IMP $D_{2,i}$ is realized.

(3.10) Through a communication network, D-CMU and H-CMU are connected. The switch $DK_i$ is turned off, and the switch $DK_{i,i+1}$ is turned on. The second voltage $V_{COND}$ is applied to the selection line of $D_{2,i}$, and the third voltage $V_{SET}$ is applied to the selection line of $H_{2,i+1}$. Therefore, the implication operation of $H_{2,i+1} \leftarrow D_{2,i}$ IMP $H_{2,i+1}$ is realized.

(3.11) Through a communication network, B-CMU and H-CMU are connected. Switches $BK_i$, $HK_i$, $HK_{i+1}$ and $BK_{i,i+1}$ are turned off, and the switch $HK_{i,i+1}$ is turned on. The second voltage $V_{COND}$ is applied to the selection line of $B_{2,i}$, and the third voltage $V_{SET}$ is applied to the selection line of $H_{2,i+1}$. Therefore, the implication operation of $H_{2,i+1} \leftarrow B_{2,i}$ IMP $H_{2,i+1}$ is realized. (If i is less than 8, i+1 returns to 3.7. If i≥8, i+1 is 3.12.)

(3.12) The first voltage $V_{CLEAR}$ is applied to the selection lines of $A_2$, $E_1$, $B_2$, $F_1$ and $C_1$ simultaneously. Therefore, $A_2$, $E_1$, $B_2$, $F_1$ and $C_1$ are in a state of high resistance.

(3.13) Through a communication network, E-CMU and G-CMU are connected, and F-CMU and H-CMU are connected. The second voltage $V_{COND}$ is applied to the selection lines of $G_2$ and $H_2$, and the third voltage $V_{SET}$ is applied to the selection lines of $E_1$ and $F_1$. Therefore, the implication operation of $E_1 \leftarrow G_2$ IMP $E_1$ and $F_1 \leftarrow H_2$ IMP $F_1$ is realized.

(3.14) Through a communication network, A-CMU and E-CMU are connected, and B-CMU and H-CMU are connected. The second voltage $V_{COND}$ is applied to the selection lines of $E_1$ and $F_1$, and the third voltage $V_{SET}$ is applied to the selection lines of $A_2$ and $B_2$. Therefore, the implication operation of $A_2 \leftarrow E_1$ IMP $A_2$ and $B_2 \leftarrow F_1$ IMP $B_2$ is realized.

(3.15) Through a communication network, A-CMU and H-CMU are connected, and B-CMU and G-CMU are connected. The second voltage $V_{COND}$ is applied to the selection lines of $H_2$ and $G_2$, and the third voltage $V_{SET}$ is applied to the selection lines of $A_2$ and $B_2$. Therefore, the implication operation of $A_2 \leftarrow H_2$ IMP $A_2$ and $B_2 \leftarrow G_2$ IMP $B_2$ is realized.

(3.16) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

(3.17) Through a communication network, B-CMU and C-CMU are connected. The second voltage $V_{COND}$ is applied to the selection line of $B_2$, and the third voltage $V_{SET}$ is applied to the selection line of $C_1$. Therefore, the implication operation of $C_1 \leftarrow B_2$ IMP $C_1$ is realized.

Compared to add operation of current computers, the add operation of the invention doesn't have steps of accessing memories frequently—reading data from memories and storing results in memories through data bus after operation—but only needs to find operand positions and positions for result storage in modules. The results are stored in corresponding positions in the modules after operation; and the add operation of the invention doesn't need arithmetic units. Meanwhile, the invention can conduct a plurality of other operations and is better in parallelism.

(4) Immediate Operand Addition

Data x is stored in $A_1$ of A-CMU. The processor is adopted to add data x to the immediate operand 128. The result is stored in $C_1$ of C-CMU. The specific operation method is as followed:

(4.1) The voltage $V_{SET}$ is applied to the selection line of a first memristor $B_{1,1}$ of a first set of memristors of a second integration unit B-CMU, and the voltage $V_{CLEAR}$ is applied to the selection lines of $2^{nd}$-$8^{th}$ memristors $B_{1,2}$-$B_{1,8}$ of first set of memristors of a second integration unit B-CMU. The immediate operand 128 is written in $B_1$.

(4.2) The first voltage $V_{CLEAR}$ is applied to the selection lines of $C_2$, $G_1$, $G_2$, $D_2$ and $H_1$. Therefore, $C_2$, $G_1$, $G_2$, $D_2$ and $H_1$ are in a state of high resistance.

(4.3) Through a communication network, A-CMU and G-CMU are connected, and B-CMU and H-CMU are connected. The second voltage $V_{COND}$ is applied to the selection lines of $A_1$ and $B_1$ simultaneously, and the third voltage $V_{SET}$ is applied to the selection lines of $G_1$ and $H_1$ simultaneously. Therefore, the implication operation of $G_1 \leftarrow A_1$ IMP $G_1$ and $H_1 \leftarrow B_1$ IMP $H_1$ is realized.

(4.4) Through a communication network, C-CMU and G-CMU are connected, and D-CMU and H-CMU are connected. The second voltage $V_{COND}$ is applied to the selection lines of $G_1$ and $H_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $C_2 \leftarrow G_1$ IMP $C_2$ and $D_2 \leftarrow H_1$ IMP $D_2$ is realized.

(4.5) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $D_2 \leftarrow A_1$ IMP $D_2$ and $C_2 \leftarrow B_1$ IMP $C_2$ is realized.

(4.6) Through a communication network, C-CMU and G-CMU are connected. The second voltage $V_{COND}$ is applied to the selection line of $C_2$, and the third voltage $V_{SET}$ is applied to the selection line of $G_2$. Therefore, the implication operation of $G_2 \leftarrow C_2$ IMP $G_2$ is realized.

(4.7) Through a communication network, D-CMU and G-CMU are connected. The second voltage $V_{COND}$ is applied to the selection line of $D_2$, and the third voltage $V_{SET}$ is applied to the selection line of $G_2$. Therefore, the implication operation of $G_2 \leftarrow D_2$ IMP $G_2$ is realized.

(4.8) The first voltage $V_{CLEAR}$ is applied to the selection lines of $B_{2,i}$, $D_{2,i}$ and $H_{2,i+1}$ simultaneously. Therefore, $B_{2,i}$, $D_{2,i}$ and $H_{2,i+1}$ are in a state of high resistance. (Initial i=1)

(4.9) Through a communication network, D-CMU and G-CMU are connected. The second voltage $V_{COND}$ is applied to the selection lines of $B_{1,i}$ and $G_{2,i}$, and the third voltage $V_{SET}$ is applied to the selection lines of $B_{2,i}$ and $D_{2,i}$. Therefore, the implication operation of $B_{2,i} \leftarrow B_{1,i}$ IMP $B_{2,i}$ and $D_{2,i} \leftarrow G_{2,i}$ IMP $D_{2,i}$ is realized.

(4.10) Through a communication network, A-CMU and B-CMU are connected, and D-CMU and H-CMU are connected. The second voltage $V_{COND}$ is applied to the selection lines of $A_{1,i}$ and $H_{2,i}$, and the third voltage $V_{SET}$ is applied to the selection lines of $B_{2,i}$ and $D_{2,i}$. Therefore, the implication operation of $B_{2,i} \leftarrow A_1$, i IMP $B_{2,i}$ and $D_{2,i} \leftarrow H_{2,i}$ IMP $D_{2,i}$ is realized.

(4.11) Through a communication network, D-CMU and H-CMU are connected. The switch $DK_i$ is turned off, and the switch $DK_{i,i+1}$ is turned on. The second voltage $V_{COND}$ is applied to the selection line of $D_{2,i}$, and the third voltage $V_{SET}$ is applied to the selection line of $H_{2,i+1}$. Therefore, the implication operation of $H_{2,i+1} \leftarrow D_{2,i}$ IMP $H_{2,i+1}$ is realized.

(4.12) Through a communication network, B-CMU and H-CMU are connected. Switches $BK_i$, $HK_i$, $HK_{i+1}$ and $BK_{i,i+1}$ are turned off, and the switch $HK_{i,i+1}$ is turned on. The second voltage $V_{COND}$ is applied to the selection line of $B_{2,i}$, and the third voltage $V_{SET}$ is applied to the selection line of $H_{2,i+1}$. Therefore, the implication operation of $H_{2,i+1} \leftarrow B_{2,i}$ IMP $H_{2,i+1}$ is realized. (If i is less than 8, i+1 returns to 4.8. If i≥8, i+1 is 4.13.)

(4.13) The first voltage $V_{CLEAR}$ is applied to the selection lines of $A_2$, $E_1$, $B_2$, $F_1$ and $C_1$ simultaneously. Therefore, $A_2$, $E_1$, $B_2$, $F_1$ and $C_1$ are in a state of high resistance.

(4.14) Through a communication network, E-CMU and G-CMU are connected, and F-CMU and H-CMU are connected. The second voltage $V_{COND}$ is applied to the selection lines of $G_2$ and $H_2$, and the third voltage $V_{SET}$ is applied to the selection lines of $E_1$ and $F_1$. Therefore, the implication operation of $E_1 \leftarrow G_2$ IMP $E_1$ and $F_1 \leftarrow H_2$ IMP $F_1$ is realized.

(4.15) Through a communication network, A-CMU and E-CMU are connected, and B-CMU and H-CMU are connected. The second voltage $V_{COND}$ is applied to the selection lines of $E_1$ and $F_{12}$, and the third voltage $V_{SET}$ is applied to the selection lines of $A_2$ and $B_2$. Therefore, the implication operation of $A_2 \leftarrow E_1$ IMP $A_2$ and $B_2 \leftarrow F_1$ IMP $B_2$ is realized.

(4.16) Through a communication network, A-CMU and H-CMU are connected, and B-CMU and G-CMU are connected. The second voltage $V_{COND}$ is applied to the selection lines of $H_2$ and $G_2$, and the third voltage $V_{SET}$ is applied to the selection lines of $A_2$ and $B_2$. Therefore, the implication operation of $A_2 \leftarrow H_2$ IMP $A_2$ and $B_2 \leftarrow G_2$ IMP $B_2$ is realized.

(4.17) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

(4.18) Through a communication network, B-CMU and C-CMU are connected. The second voltage $V_{COND}$ is applied to the selection line of $B_2$, and the third voltage $V_{SET}$ is applied to the selection line of $C_1$. Therefore, the implication operation of $C_1 \leftarrow B_2$ IMP $C_1$ is realized.

Compared to the immediate operand add operation of current computers, the immediate operand addition of the invention doesn't need to read data in memories. After operation, the results are stored in memories again by data bus. The invention only needs to find operand positions and positions for result storage in modules. The results are stored in corresponding positions in the modules after operation; and the immediate operand add operation of the invention doesn't need arithmetic units. Meanwhile, the invention can conduct a plurality of other operations and is better in parallelism.

(5) AND

Data x is stored in $A_1$ of A-CMU. Data y is stored in $B_1$ of B-CMU. The processor is adopted to realize AND operation of data x and data y. The result is stored in $C_1$ of C-CMU. The specific operation method is as follows:

(5.1) The first voltage $V_{CLEAR}$ is applied to the selection lines of $C_1$ and $C_2$ simultaneously. $C_1$ and $C_2$ are in a state of high resistance.

(5.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(5.3) Through a communication network, A-CMU and C-CMU are connected. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(5.4) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

Compared to AND operation of current computers, the AND operation of the invention doesn't need to read data in memories. After operation, the results are stored in memories again by data bus. The invention only needs to find operand positions and positions for result storage in modules. The results are stored in corresponding positions in the modules after operation; and the AND operation of the invention doesn't need arithmetic units. Meanwhile, the invention can conduct a plurality of other operations and is better in parallelism.

(6) OR

Data x is stored in $A_1$ of A-CMU. Data y is stored in $B_1$ of B-CMU. The processor is adopted to realize OR operation of data x and data y. The result is stored in $C_1$ of C-CMU. The specific operation method is as follows:

(6.1) The first voltage $V_{CLEAR}$ is applied to the selection lines of $C_1$, $C_2$ and $A_2$ simultaneously. Therefore, $C_1$, $C_2$ and $A_2$ are in a state of high resistance.

(6.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(6.3) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(6.4) The second voltage $V_{COND}$ is applied to the selection line of $A_1$, and the third voltage $V_{SET}$ is applied to the selection line of $A_2$. Therefore, the implication operation of $A_2 \leftarrow A_1$ IMP $A_2$ is realized.

(6.5) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

Compared to OR operation of current computers, the OR operation of the invention doesn't need to read data in memories. After operation, the results are stored in memories again by data bus. The invention only needs to find operand positions and positions for result storage in modules. The results are stored in corresponding positions in the modules after operation; and the OR operation of the invention doesn't need arithmetic units. Meanwhile, the invention can conduct other operation and is better in parallelism.

(7) NOT

Data x is stored in $A_1$ of A-CMU. The processor is adopted to realize the NOT operation of data x. The result is stored in $A_2$ of A-CMU. The specific operation method is as follows:

(7.1) The first voltage $V_{CLEAR}$ is applied to the selection line of $A_2$. Therefore, $A_2$ is in a state of high resistance.

(7.2) The second voltage $V_{COND}$ is applied to the selection line of $A_1$, and the third voltage $V_{SET}$ is applied to the selection line of $A_2$. Therefore, the implication operation $A_2 \leftarrow A_1$ IMP $A_2$ is realized.

Compared to NOT operation of current computers, the NOT operation of the invention doesn't need to read data in memories. After operation, the results are stored in memories again by data bus. The invention only needs to find operand positions and positions for result storage in modules. The results are stored in corresponding positions in the modules after operation; and the NOT operation of the invention doesn't need arithmetic units. Meanwhile, the invention can conduct other operation and is better in parallelism.

(8) XOR

Data x is stored in $A_1$ of A-CMU. Data y is stored in $B_1$ of B-CMU. The processor is adopted to realize XOR operation of data x and data y. The result is stored in $C_1$ of C-CMU. The specific operation method is as follows:

(8.1) The first voltage $V_{CLEAR}$ is applied to the selection lines of $C_1$, $C_2$, $A_2$, $D_1$ and $D_2$ simultaneously. Therefore, $C_1$, $C_2$, $A_2$, $D_1$ and $D_2$ are in a state of high resistance.

(8.2) Through a communication network, B-CMU and D-CMU are connected. The second voltage $V_{COND}$ is applied to the selection lines of $A_1$ and $B_1$ simultaneously, and the third voltage $V_{SET}$ is applied to the selection lines of $A_2$ and $D_2$ simultaneously. Therefore, the implication operation of $A_2 \leftarrow A_1$ IMP $A_2$ and $D_2 \leftarrow B_1$ IMP $D_2$ is realized.

(8.3) Through a communication network, A-CMU and C-CMU are connected. The second voltage $V_{COND}$ is applied to the selection lines of $A_2$ and $D_2$ simultaneously, and the third voltage $V_{SET}$ is applied to the selection lines of $C_2$ and $D_1$ simultaneously. Therefore, the implication operation of $C_2 \leftarrow A_2$ IMP $C_2$ and $D_2 \leftarrow D_1$ IMP $D_2$ is realized.

(8.4) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_1$ simultaneously. Therefore, the implication operation of $D_1 \leftarrow A_1$ IMP $D_1$ and $C_2 \leftarrow B_1$ IMP $C_2$ is realized.

(8.5) Through a communication network, B-CMU and C-CMU are connected. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(8.6) Through a communication network, C-CMU and D-CMU are connected. The second voltage $V_{COND}$ is applied to the selection line of $D_1$, and the third voltage $V_{SET}$ is applied to the selection line of $C_1$. Therefore, the implication operation of $C_1 \leftarrow D_1$ IMP $C_1$ is realized.

Compared to XOR operation of current computers, the XOR operation of the invention doesn't need to read data in memories. After operation, the results are stored in memories again by data bus. The invention only needs to find operand positions and positions for result storage in modules. The results are stored in corresponding positions in the modules after operation; and the XOR operation of the invention doesn't need arithmetic units. Meanwhile, the invention can conduct other operation and is better in parallelism.

(9) NOR

Data x is stored in $A_1$ of A-CMU. Data y is stored in $B_1$ of B-CMU. The processor is adopted to realize NOR operation of data x and data y. The result is stored in $C_1$ of C-CMU. The specific operation method is as follows:

(9.1) The first voltage $V_{CLEAR}$ is applied to the selection lines of $C_1$, $C_2$, $A_2$ and $B_2$ simultaneously. Therefore, $C_1$, $C_2$, $A_2$ and $B_2$ are in a state of high resistance.

(9.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(9.3) Through a communication network, B-CMU and C-CMU are connected. The second voltage $V_{COND}$ is applied to the selection line of $C_2$, and the third voltage $V_{SET}$ is applied to the selection line of $B_2$. Therefore, the implication operation of $B_2 \leftarrow C_2$ IMP $B_2$ is realized.

(9.4) The second voltage $V_{COND}$ is applied to the selection line of $A_1$, and the third voltage $V_{SET}$ is applied to the selection line of $A_2$. Therefore, the implication operation of $A_2 \leftarrow A_1$ IMP $A_2$ is realized.

(9.5) Through a communication network, A-CMU and B-CMU are connected. The second voltage $V_{COND}$ is applied to the selection line of $A_2$, and the third voltage $V_{SET}$ is applied to the selection line of $B_2$. Therefore, the implication operation of $B_2 \leftarrow A_2$ IMP $B_2$ is realized.

(9.6) Through a communication network, B-CMU and C-CMU are connected. The second voltage $V_{COND}$ is applied to the selection line of $B_2$, and the third voltage $V_{SET}$ is applied to the selection line of $C_1$. Therefore, the implication operation of $C_1 \leftarrow B_2$ IMP $C_1$ is realized.

Compared to NOR operation of current computers, the NOR operation of the invention doesn't need to read data in memories. After operation, the results are stored in memories again by data bus. The invention only needs to find operand positions and positions for result storage in modules. The results are stored in corresponding positions in the modules after operation; and the NOR operation of the invention doesn't need arithmetic units. Meanwhile, the invention can conduct other operation and is better in parallelism.

(10) Immediate Operand AND

Data x is stored in $A_1$ of A-CMU. The processor is adopted to realize the AND operation of data x and the immediate operand 128. The result is stored in $C_1$ of C-CMU. The specific operation method is as follows:

(10.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU simultaneously. The operand 128 is written in $B_1$.

(10.2) The first voltage $V_{CLEAR}$ is applied to the selection lines of $C_1$ and $C_2$. Therefore, $C_1$ and $C_2$ are in a state of high resistance.

(10.3) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(10.4) Through a communication network, A-CMU and C-CMU are connected. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(10.5) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

Compared to immediate operand AND operation of current computers, the immediate operand AND operation of the invention doesn't need to read data in memories. After operation, the results are stored in memories again by data bus. The invention only needs to find operand positions and positions for result storage in modules. The results are stored in corresponding positions in the modules after operation; and the immediate operand AND operation of the invention doesn't need arithmetic units. Meanwhile, the invention can conduct other operation and is better in parallelism.

(11) Immediate Operand OR

Data x is stored in $A_1$ of A-CMU. The processor is adopted to realize the OR operation of data x and the immediate operand 128. The result is stored in $C_1$ of C-CMU. The specific operation method is as follows:

(11.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU simultaneously. The operand 128 is written in $B_1$.

11.2) The first voltage $V_{CLEAR}$ is applied to the selection lines of $C_1$, $C_2$ and $A_2$ simultaneously. Therefore, $C_1$, $C_2$ and $A_2$ are in a state of high resistance.

(11.3) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(11.4) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(11.5) The second voltage $V_{COND}$ is applied to the selection line of $A_1$, and the third voltage $V_{SET}$ is applied to the selection line of $A_2$. Therefore, the implication operation of $A_2 \leftarrow A_1$ IMP $A_2$ is realized.

(11.6) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

Compared to immediate operand OR operation of current computers, the immediate operand OR operation of the invention doesn't need to read data in memories. After operation, the results are stored in memories again by data bus. The invention only needs to find operand positions and positions for result storage in modules. The results are stored in corresponding positions in the modules after operation; and the immediate operand OR operation of the invention doesn't need arithmetic units. Meanwhile, the invention can conduct other operation and is better in parallelism.

(12) Immediate Operand XOR

Data x is stored in $A_1$ of A-CMU. The processor is adopted to realize the XOR operation of data x and the immediate operand 128. The result is stored in $C_1$ of C-CMU. The specific operation method is as follows:

(12.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU. The immediate operand 128 is written in $B_1$.

(12.2) The first voltage $V_{CLEAR}$ is applied to the selection lines of $C_1$, $C_2$, $A_2$, $D_1$ and $D_2$ simultaneously. Therefore, $C_1$, $C_2$, $A_2$, $D_1$ and $D_2$ are in a state of high resistance.

(12.3) Through a communication network, B-CMU and D-CMU are connected. The second voltage $V_{COND}$ is applied to the selection lines of $A_1$ and $B_1$ simultaneously, and the third voltage $V_{SET}$ is applied to the selection lines of $A_2$ and $D_2$ simultaneously. Therefore, the implication operation of $A_2 \leftarrow A_1$ IMP $A_2$ and $D_2 \leftarrow B_1$ IMP $D_2$ is realized.

(12.4) Through a communication network, A-CMU and C-CMU are connected. The second voltage $V_{COND}$ is applied to the selection lines of $A_2$ and $D_2$ simultaneously, and the third voltage $V_{SET}$ is applied to the selection lines of $C_2$ and $D_1$ simultaneously. Therefore, the implication operation of $C_2 \leftarrow A_2$ IMP $C_2$ and $D_2 \leftarrow D_1$ IMP $D_2$ is realized.

(12.5) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_1$ simultaneously. Therefore, the implication operation of $D_1 \leftarrow A_1$ IMP $D_1$ and $C_2 \leftarrow B_1$ IMP $C_2$ is realized.

(12.6) Through a communication network, B-CMU and C-CMU are connected. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(12.7) Through a communication network, C-CMU and D-CMU are connected. The second voltage $V_{COND}$ is applied to the selection line of $D_1$, and the third voltage $V_{SET}$ is applied to the selection line of $C_1$. Therefore, the implication operation of $C_1 \leftarrow D_1$ IMP $C_1$ is realized.

Compared to immediate operand XOR operation of current computers, the immediate operand XOR operation of the invention doesn't need to read data in memories. After operation, the results are stored in memories again by data bus. The invention only needs to find operand positions and positions for result storage in modules. The results are stored in corresponding positions in the modules after operation; and the immediate operand XOR operation of the invention doesn't need arithmetic units. Meanwhile, the invention can conduct other operation and is better in parallelism.

(13) Shift Left by m Bits

Data x is stored in $A_1$ of A-CMU. The processor is adopted to shift data x left by a single bit to be stored in $C_1$ of C-CMU. The specific operation method is as follows:

(13.1) The first voltage $V_{CLEAR}$ is applied to the selection lines of $C_1$ and $C_2$. Therefore, $C_1$ and $C_2$ are in a state of high resistance.

(13.2) Through a communication network, A-CMU and C-CMU are connected, and $A_{1,\ i+m} = C_{1,\ i}$. The switch $CK_1$ is turned off. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(13.3) The switch $CK_1$ is turned off. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

Compared to the left m-bit shift operation of current computers, the left m-bit shift operation of the invention doesn't need to read data in memories. After operation, the results are stored in memories again by data bus. The invention only needs to find operand positions and positions for result storage in modules. The results are stored in corresponding positions in the modules after operation; and the left m-bit shift operation of the invention doesn't need arithmetic units. Meanwhile, the invention can conduct other operation and is better in parallelism.

(14) Shift Right by m Bits

Data x is stored in $A_1$ of A-CMU. The processor is adopted to shift data x left by a single bit to be stored in $C_1$ of C-CMU. The specific operation method is as follows:

(14.1) The first voltage $V_{CLEAR}$ is applied to the selection lines of $C_1$ and $C_2$. Therefore, $C_1$ and $C_2$ are in a state of high resistance.

(14.2) Through a communication network, A-CMU and C-CMU are connected, and $A_{1,\ i+m} = C_{1,\ i}$. The switch $CK_1$ is turned off. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(14.3) The switch $CK_1$ is turned off. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

Compared to the right m-bit shift operation of current computers, the right m-bit shift operation of the invention doesn't need to read data in memories. After operation, the results are stored in memories again by data bus. The invention only needs to find operand positions and positions for result storage in modules. The results are stored in corresponding positions in the modules after operation; and the right m-bit shift operation of the invention doesn't need arithmetic units. Meanwhile, the invention can conduct other operation and is better in parallelism.

2. When N≥4, M is any positive integer and the specific operation methods are the same. In order to explain the invention more easily, now N=2, M=8 is taken as an example for detailed explanations as follows:

(1) Data Transmission

Data x is stored in $A_1$ of A-CMU. Data x is stored in $B_1$ of B-CMU. The specific operation methods are as follows:

(1.1) The first voltage $V_{CLEAR}$ is applied to the selection lines of $B_1$ and $B_2$ simultaneously. Therefore, $B_1$ and $B_2$ are in a state of high resistance.

(1.2) Through a communication network, A-CMU and B-CMU are connected. The second voltage $V_{COND}$ is applied to the selection line of $A_1$, and the third voltage $V_{SET}$ is applied to the selection line of $B_2$. Therefore, the implication operation of $B_2 \leftarrow A_1$ IMP $B_2$ is realized.

(1.3) The second voltage $V_{COND}$ is applied to the selection line of $B_2$, and the third voltage $V_{SET}$ is applied to the selection line of $B_1$. Therefore, the implication operation of $B_1 \leftarrow B_2$ IMP $B_1$ is realized.

(2) Data Exchange

Data x is stored in $A_1$ of A-CMU. Data y is stored in $B_1$ of B-CMU. The processor is adopted to exchange positions of data x and data y. The specific operation methods are as follows:

(2.1) The first voltage $V_{CLEAR}$ is applied to the selection lines of $C_1$, $C_2$, $D_1$ and $D_2$. Therefore, $C_1$, $C_2$, $D_1$ and $D_2$ are in a state of high resistance.

(2.2) Through a communication network, A-CMU and C-CMU are connected, and B-CMU and D-CMU are connected. The second voltage $V_{COND}$ is applied to the selection lines of $A_1$ and $B_1$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $C_2 \leftarrow A_1$ IMP $C_2$ and $D_2 \leftarrow B_1$ IMP $D_2$ is realized.

(2.3) The second voltage $V_{COND}$ is applied to the selection lines of a second set of memristors $C_2$ of the third integration unit C-CMU and a second set of memristors $D_2$ of the fourth integration unit D-CMU simultaneously, and the third voltage $V_{SET}$ is applied to the a first set of memristors $C_1$ of the third integration unit C-CMU and a first set of memristors D1 of the fourth integration unit D-CMU simultaneously. Therefore, the implication operation of $C_1 \leftarrow C_2$ IMP $C_1$ and $D_1 \leftarrow D_2$ IMP $D_1$ is realized.

(2.4) The first voltage $V_{CLEAR}$ is applied to the selection lines of $A_1, A_2, B_1$ and $B_2$ simultaneously. Therefore, $A_1, A_2, B_1$ and $B_2$ are in a state of high resistance.

(2.5) Through a communication network, A-CMU and D-CMU are connected, and B-CMU and C-CMU are connected. The second voltage $V_{COND}$ is applied to the a first set of memristors $C_1$ of the third integration unit C-CMU and a first set of memristors D1 of the fourth integration unit D-CMU simultaneously, and the third voltage $V_{SET}$ is applied to the selection lines of $A_2$ and $B_2$ simultaneously. Therefore, the implication operation of $A_2 \leftarrow D_1$ IMP $A_2$ and $B_2 \leftarrow C_1$ IMP $B_2$ is realized.

(2.6) The second voltage $V_{COND}$ is applied to the selection lines of $A_2$ and $B_2$ simultaneously, and the third voltage $V_{SET}$ is applied to the selection lines of $A_1$ and $B_1$ simultaneously. Therefore, the implication operation of $A_1 \leftarrow A_2$ IMP $A_1$ and $B_1 \leftarrow B_2$ IMP $B_1$ is realized.

(3) Addition

Data x is stored in $A_1$ of A-CMU. Data y is stored in $B_1$ of B-CMU. The processor is adopted to add data x to data y and then store the result in $C_1$ of C-CMU. The specific operation method is as follows:

(3.1) The first voltage $V_{CLEAR}$ is applied to the selection lines of $C_2, C_3, C_4, D_2$ and $D_3$. Therefore, $C_2, C_3, C_4, D_2$ and $D_3$ are in a state of high resistance.

(3.2) Through a communication network, A-CMU and C-CMU are connected, and B-CMU and D-CMU are connected. The second voltage $V_{COND}$ is applied to the selection lines of $A_1$ and $B_1$ simultaneously, and the third voltage $V_{SET}$ is applied to the selection lines of $C_3$ and $D_3$ simultaneously. Therefore, the implication operation of $C_3 \leftarrow A_1$ IMP $C_3$ and $D_3 \leftarrow B_1$ IMP $D_3$ is realized.

(3.3) Through a communication network, C-CMU and D-CMU are connected. The second voltage $V_{COND}$ is applied to the selection lines of $C_3$ and $D_3$ simultaneously, and the third voltage $V_{SET}$ is applied to the selection lines of a second set of memristors $C_2$ of the third integration unit C-CMU and a second set of memristors $D_2$ of the fourth integration unit D-CMU simultaneously. Therefore, the implication operation of $C_2 \leftarrow C_3$ IMP $C_2$ and $D_2 \leftarrow D_3$ IMP $D_2$ is realized.

(3.4) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_2$ simultaneously. Therefore, the implication operation of $D_2 \leftarrow A_1$ IMP $D_2$ and $C_2 \leftarrow B_1$ IMP $C_2$ is realized.

(3.5) The second voltage $V_{COND}$ is applied to the selection line of $C_2$, and the third voltage $V_{SET}$ is applied to the selection line of $C_4$. Therefore, the implication operation of $C_4 \leftarrow C_2$ IMP $C_4$ is realized.

(3.6) Through a communication network, C-CMU and D-CMU are connected. The second voltage $V_{COND}$ is applied to the selection line of $D_2$, and the third voltage $V_{SET}$ is applied to the selection line of $C_4$. Therefore, the implication operation of $G_2 \leftarrow D_2$ IMP $G_2$ is realized.

(3.7) The first voltage $V_{CLEAR}$ is applied to the selection lines of $B_{2,\,i}, D_{2,\,i}$ and $D_{4,\,i+1}$ simultaneously. Therefore, $B_{2,\,i}, D_{2,\,i}$ and $D_{4,\,i+1}$ are in a state of high resistance. (Initial i=1)

(3.8) Through a communication network, C-CMU and D-CMU are connected. The second voltage $V_{COND}$ is applied to the selection lines of $B_{1,\,i}$ and $C_{4,\,i}$, and the third voltage $V_{SET}$ is applied to the selection lines of $B_{2,\,i}$ and $D_{2,\,i}$. Therefore, the implication operation of $B_{2,\,i} \leftarrow B_{1,\,i}$ IMP $B_{2,\,i}$ and $D_{2,\,i} \leftarrow C_4$, i IMP $D_{2,\,i}$ is realized.

(3.9) Through a communication network, A-CMU and B-CMU are connected. The second voltage $V_{COND}$ is applied to the selection lines of $A_{1,\,i}$ and $D_{4,\,i}$, and the third voltage $V_{SET}$ is applied to the selection lines of $B_{2,\,i}$ and $D_{2,\,i}$. Therefore, the implication operation of $B_{2,\,i} \leftarrow A_{1,\,i}$ IMP $B_{2,\,i}$ and $D_{2,\,i} \leftarrow D_4$, i IMP $D_{2,\,i}$ is realized.

(3.10) The switch $DK_i$ is turned off, and the switch $DK_{i,\,i+1}$ is turned on. The second voltage $V_{COND}$ is applied to the selection line of $D_{2,\,i}$, and the third voltage $V_{SET}$ is applied to the selection line of $D_{4,\,i+1}$. Therefore, the implication operation of $D_{4,\,i+1} \leftarrow D_{2,\,i}$ IMP $D_{4,\,i+1}$ is realized.

(3.11) Through a communication network, B-CMU and D-CMU are connected. Switches $BK_i$, $DK_i$, $DK_{i+1}$ and $BK_{i,\,i+1}$ are turned off, and the switch $DK_{i,\,i+1}$ is turned on. The second voltage $V_{COND}$ is applied to the selection line of $B_{2,\,i}$, and the third voltage $V_{SET}$ is applied to the selection line of $D_{4,\,i+1}$. Therefore, the implication operation of $D_{4,\,i+1} \leftarrow B_{2,\,i}$ IMP $D_{4,\,i+1}$ is realized. (If i is less than 8, i+1 returns to 3.7. If i≥8, i+1 is 3.12.)

(3.12) The first voltage $V_{CLEAR}$ is applied to the selection lines of $A_2, A_3, B_2, B_3$ and $C_1$ simultaneously. Therefore, $A_2, A_3, B_2, B_3$ and $C_1$ are in a state of high resistance.

(3.13) Through a communication network, A-CMU and C-CMU are connected, and B-CMU and D-CMU are connected. The second voltage $V_{COND}$ is applied to the selection lines of $C_4$ and $D_4$ simultaneously, and the third voltage $V_{SET}$ is applied to the selection lines of $A_3$ and $B_3$ simultaneously. Therefore, the implication operation of $A_3 \leftarrow C_4$ IMP $A_3$ and $B_3 \leftarrow D_4$ IMP $B_3$ is realized.

(3.14) The second voltage $V_{COND}$ is applied to the selection lines of $A_3$ and $B_3$ simultaneously, and the third voltage $V_{SET}$ is applied to the selection lines of $A_2$ and $B_2$. Therefore, the implication operation of $A_2 \leftarrow A_3$ IMP $A_2$ and $B_2 \leftarrow B_3$ IMP $B_2$ is realized.

(3.15) Through a communication network, A-CMU and D-CMU are connected, and B-CMU and C-CMU are connected. The second voltage $V_{COND}$ is applied to the selection lines of $C_4$ and $D_4$ simultaneously, and the third voltage $V_{SET}$ is applied to the selection lines of $A_2$ and $B_2$ simultaneously. Therefore, the implication operation of $A_2 \leftarrow D_4$ IMP $A_2$ and $B_2 \leftarrow C_4$ IMP $B_2$ is realized.

(3.16) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

(3.17) Through a communication network, B-CMU and C-CMU are connected. The second voltage $V_{COND}$ is applied to the selection line of $B_2$, and the third voltage $V_{SET}$ is applied to the selection line of $C_1$. Therefore, the implication operation of $C_1 \leftarrow B_2$ IMP $C_1$ is realized.

(4) Immediate Operand Addition

Data x is stored in $A_1$ of A-CMU. The processor is adopted to add data x to the immediate operand 128. The result is stored in $C_1$ of C-CMU. The specific operation method is as followed:

(4.1) The voltage $V_{SET}$ is applied to the selection line of a first memristor $B_{1,\,1}$ of a first set of memristors of a second integration unit B-CMU, and the voltage $V_{CLEAR}$ is applied to the selection lines of $2^{nd}$-$8^{th}$ memristors $B_{1,\,2}$-$B_{1,\,8}$ of first set of memristors of a second integration unit B-CMU. The immediate operand 128 is written in $B_1$.

(4.2) The first voltage $V_{CLEAR}$ is applied to the selection lines of $C_2, C_3, C_4, D_2$ and $D_3$. Therefore, $C_2, C_3, C_4, D_2$ and $D_3$ are in a state of high resistance.

(4.3) Through a communication network, A-CMU and C-CMU are connected, and B-CMU and D-CMU are connected. The second voltage $V_{COND}$ is applied to the selection lines of $A_1$ and $B_1$ simultaneously, and the third voltage $V_{SET}$ is applied to the selection lines of $C_3$ and $D_3$ simultaneously. Therefore, the implication operation of $C_3 \leftarrow A_1$ IMP $C_3$ and $D_3 \leftarrow B_1$ IMP $D_3$ is realized.

(4.4) Through a communication network, C-CMU and D-CMU are connected. The second voltage $V_{COND}$ is applied to the selection lines of $C_3$ and $D_3$ simultaneously, and the third voltage $V_{SET}$ is applied to the selection lines of $C_2$ and $D_2$ simultaneously. Therefore, the implication operation of $C_2 \leftarrow C_3$ IMP $C_2$ and $D_2 \leftarrow D_3$ IMP $D_2$ is realized.

(4.5) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_2$ simultaneously. Therefore, the implication operation of $D_2 \leftarrow A_1$ IMP $D_2$ and $C_2 \leftarrow B_1$ IMP $C_2$ is realized.

(4.6) The second voltage $V_{COND}$ is applied to the selection line of $C_2$, and the third voltage $V_{SET}$ is applied to the selection line of $C_4$. Therefore, the implication operation of $C_4 \leftarrow C_2$ IMP $C_4$ is realized.

(4.7) Through a communication network, C-CMU and D-CMU are connected. The second voltage $V_{COND}$ is applied to the selection line of $D_2$, and the third voltage $V_{SET}$ is applied to the selection line of $C_4$. Therefore, the implication operation of $G_2 \leftarrow D_2$ IMP $G_2$ is realized.

(4.8) The first voltage $V_{CLEAR}$ is applied to the selection lines of $B_{2,i}$, $D_{2,i}$ and $D_{4,i+1}$ simultaneously. Therefore, $B_{2,i}$, $D_{2,i}$ and $D_{4,i+1}$ are in a state of high resistance. (Initial i=1)

(4.9) Through a communication network, C-CMU and D-CMU are connected. The second voltage $V_{COND}$ is applied to the selection lines of $B_{1,i}$ and $C_{4,i}$, and the third voltage $V_{SET}$ is applied to the selection lines of $B_{2,i}$ and $D_{2,i}$. Therefore, the implication operation of $B_{2,i} \leftarrow B_{1,i}$ IMP $B_{2,i}$ and $D_{2,i} \leftarrow C_4$, i IMP $D_{2,i}$ is realized.

(4.10) Through a communication network, A-CMU and B-CMU are connected. The second voltage $V_{COND}$ is applied to the selection lines of $A_{1,i}$ and $D_{4,i}$, and the third voltage $V_{SET}$ is applied to the selection lines of $B_{2,i}$ and $D_{2,i}$. Therefore, the implication operation of $B_{2,i} \leftarrow A_{1,i}$ IMP $B_{2,i}$ and $D_{2,i} \leftarrow D_4$, i IMP $D_{2,i}$ is realized.

(4.11) The switch $DK_i$ is turned off, and the switch $DK_{i,i+1}$ is turned on. The second voltage $V_{COND}$ is applied to the selection line of $D_{2,i}$, and the third voltage $V_{SET}$ is applied to the selection line of $D_{4,i+1}$. Therefore, the implication operation of $D_{4,i+1} \leftarrow D_{2,i}$ IMP $D_{4,i+1}$ is realized.

(4.12) Through a communication network, B-CMU and D-CMU are connected. Switches $BK_i$, $DK_i$, $DK_{i+1}$ and $BK_{i,i+1}$ are turned off, and the switch $DK_{i,i+1}$ is turned on. The second voltage $V_{COND}$ is applied to the selection line of $B_{2,i}$, and the third voltage $V_{SET}$ is applied to the selection line of $D_{4,i+1}$. Therefore, the implication operation of $D_{4,i+1} \leftarrow B_{2,i}$ IMP $D_{4,i+1}$ is realized. (If i is less than 8, i+1 returns to 4.8. If i≥8, i+1 is 4.13.)

(4.13) The first voltage $V_{CLEAR}$ is applied to the selection lines of $A_2$, $A_3$, $B_2$, $B_3$ and $C_1$ simultaneously. Therefore, $A_2$, $A_3$, $B_2$, $B_3$ and $C_1$ are in a state of high resistance.

(4.14) Through a communication network, A-CMU and C-CMU are connected, and B-CMU and D-CMU are connected. The second voltage $V_{COND}$ is applied to the selection lines of $C_4$ and $D_4$ simultaneously, and the third voltage $V_{SET}$ is applied to the selection lines of $A_3$ and $B_3$ simultaneously. Therefore, the implication operation of $A_3 \leftarrow C_4$ IMP $A_3$ and $B_3 \leftarrow D_4$ IMP $B_3$ is realized.

(4.15) The second voltage $V_{COND}$ is applied to the selection lines of $A_3$ and $B_3$ simultaneously, and the third voltage $V_{SET}$ is applied to the selection lines of $A_2$ and $B_2$. Therefore, the implication operation of $A_2 \leftarrow A_3$ IMP $A_2$ and $B_2 \leftarrow B_3$ IMP $B_2$ is realized.

(4.16) Through a communication network, A-CMU and D-CMU are connected, and B-CMU and C-CMU are connected. The second voltage $V_{COND}$ is applied to the selection lines of $D_4$ and $C_4$ simultaneously, and the third voltage $V_{SET}$ is applied to the selection lines of $A_2$ and $B_2$ simultaneously. Therefore, the implication operation of $A_2 \leftarrow D_4$ IMP $A_2$ and $B_2 \leftarrow C_4$ IMP $B_2$ is realized.

(4.17) Through a communication network, A-CMU and C-CMU are connected. The second voltage $V_{COND}$ is applied to the selection line of $A_2$, and the third voltage $V_{SET}$ is applied to the selection line of $C_1$. Therefore, the implication operation of $C_1 \leftarrow A_2$ IMP $C_1$ is realized.

(4.18) Through a communication network, B-CMU and C-CMU are connected. The second voltage $V_{COND}$ is applied to the selection line of $B_2$, and the third voltage $V_{SET}$ is applied to the selection line of $C_1$. Therefore, the implication operation of $C_1 \leftarrow B_2$ IMP $C_1$ is realized.

(5) AND

Data x is stored in $A_1$ of A-CMU. Data y is stored in $B_1$ of B-CMU. The processor is adopted to realize AND operation of data x and data y. The result is stored in $C_1$ of C-CMU. The specific operation method is as follows:

(5.1) The first voltage $V_{CLEAR}$ is applied to the selection lines of $C_1$ and $C_2$ simultaneously. Therefore, $C_1$ and $C_2$ are in a state of high resistance.

(5.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(5.3) Through a communication network, A-CMU and C-CMU are connected. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(5.4) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(6) OR (6) Data x is stored in $A_1$ of A-CMU. Data y is stored in $B_1$ of B-CMU. The processor is adopted to realize OR operation of data x and data y. The result is stored in $C_1$ of C-CMU. The specific operation method is as follows:

(6.1) The first voltage $V_{CLEAR}$ is applied to the selection lines of $C_1$, $C_2$ and $C_3$ simultaneously. Therefore, $C_1$, $C_2$ and $C_3$ are in a state of high resistance.

(6.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(6.3) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(6.4) The second voltage $V_{COND}$ is applied to the selection line of $A_1$, and the third voltage $V_{SET}$ is applied to the selection line of $C_3$. Therefore, the implication operation of $C_3 \leftarrow A_1$ IMP $C_3$ is realized.

(6.5) Through a communication network, A-CMU and C-CMU are connected. The second voltage $V_{COND}$ is applied to the selection line of $C_3$, and the third voltage $V_{SET}$ is applied to the selection line of $C_1$. Therefore, the implication operation of $C_1 \leftarrow C_3$ IMP $C_1$ is realized.

(7) NOT

Data x is stored in $A_1$ of A-CMU. The processor is adopted to realize the NOT operation of data x. The result is stored in $A_2$ of A-CMU. The specific operation method is as follows:

(7.1) The first voltage $V_{CLEAR}$ is applied to the selection line of $A_2$. Therefore, $A_2$ is in a state of high resistance.

(7.2) The second voltage $V_{COND}$ is applied to the selection line of $A_1$, and the third voltage $V_{SET}$ is applied to the selection line of $A_2$. Therefore, the implication operation $A_2 \leftarrow A_1$ IMP $A_2$ is realized.

(8) XOR

Data x is stored in $A_1$ of A-CMU. Data y is stored in $B_1$ of B-CMU. The processor is adopted to realize XOR operation of data x and data y. The result is stored in $C_1$ of C-CMU. The specific operation method is as follows:

(8.1) The first voltage $V_{CLEAR}$ is applied to the selection lines of $C_1$, $C_2$, $A_2$, $D_1$ and $D_2$ simultaneously. Therefore, $C_1$, $C_2$, $A_2$, $D_1$ and $D_2$ are in a state of high resistance.

(8.2) Through a communication network, B-CMU and D-CMU are connected. The second voltage $V_{COND}$ is applied to the selection lines of $A_1$ and $B_1$ simultaneously, and the third voltage $V_{SET}$ is applied to the selection lines of $A_2$ and $D_2$ simultaneously. Therefore, the implication operation of $A_2 \leftarrow A_1$ IMP $A_2$ and $D_2 \leftarrow B_1$ IMP $D_2$ is realized.

(8.3) Through a communication network, A-CMU and C-CMU are connected. The second voltage $V_{COND}$ is applied to the selection lines of $A_2$ and $D_2$ simultaneously, and the third voltage $V_{SET}$ is applied to the selection lines of $C_2$ and $D_1$ simultaneously. Therefore, the implication operation of $C_2 \leftarrow A_2$ IMP $C_2$ and $D_2 \leftarrow D_1$ IMP $D_2$ is realized.

(8.4) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_1$ simultaneously. Therefore, the implication operation of $D_1 \leftarrow A_1$ IMP $D_1$ and $C_2 \leftarrow B_1$ IMP $C_2$ is realized.

(8.5) Through a communication network, B-CMU and C-CMU are connected. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(8.6) Through a communication network, C-CMU and D-CMU are connected. The second voltage $V_{COND}$ is applied to the selection line of $D_1$, and the third voltage $V_{SET}$ is applied to the selection line of $C_1$. Therefore, the implication operation of $C_1 \leftarrow D_1$ IMP $C_1$ is realized.

(9) NOR

Data x is stored in $A_1$ of A-CMU. Data y is stored in $B_1$ of B-CMU. The processor is adopted to realize NOR operation of data x and data y. The result is stored in $C_1$ of C-CMU. The specific operation method is as follows:

(9.1) The first voltage $V_{CLEAR}$ is applied to the selection lines of $C_1$, $C_2$, $C_3$ and $C_4$ simultaneously. Therefore, $C_1$, $C_2$, $C_3$ and $C_4$ are in a state of high resistance.

(9.2) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(9.3) The second voltage $V_{COND}$ is applied to the selection line of $C_2$, and the third voltage $V_{SET}$ is applied to the selection line of $C_4$. Therefore, the implication operation of $C_4 \leftarrow C_2$ IMP $C_4$ is realized.

(9.4) Through a communication network, A-CMU and C-CMU are connected. The second voltage $V_{COND}$ is applied to the selection line of $A_1$, and the third voltage $V_{SET}$ is applied to the selection line of $A_2$. Therefore, the implication operation of $C_3 \leftarrow A_1$ IMP $C_3$ is realized.

(9.5) The second voltage $V_{COND}$ is applied to the selection line of $C_3$, and the third voltage $V_{SET}$ is applied to the selection line of $C_4$. Therefore, the implication operation of $C_4 \leftarrow C_3$ IMP $C_4$ is realized.

(9.6) The second voltage $V_{COND}$ is applied to the selection line of $C_4$, and the third voltage $V_{SET}$ is applied to the selection line of $C_1$. Therefore, the implication operation of $C_1 \leftarrow C_4$ IMP $C_1$ is realized.

(10) Immediate Operand AND

Data x is stored in $A_1$ of A-CMU. The processor is adopted to realize the NOR operation of data x and the immediate operand 128. The result is stored in $C_1$ of C-CMU. The specific operation method is as follows:

(10.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU simultaneously. The operand 128 is written in $B_1$.

(10.2) The first voltage $V_{CLEAR}$ is applied to the selection lines of $C_1$ and $C_2$. Therefore, $C_1$ and $C_2$ are in a state of high resistance.

(10.3) Through a communication network, B-CMU and C-CMU are connected. The second voltage $V_{COND}$ is applied to the selection line of $B_2$, and the third voltage $V_{SET}$ is applied to the selection line of $C_2$. Therefore, the implication operation of $C_2 \leftarrow B_1$ IMP $C_2$ is realized.

(10.4) Through a communication network, A-CMU and C-CMU are connected. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(10.5) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(11) Immediate Operand OR

Data x is stored in $A_1$ of A-CMU. The processor is adopted to realize the OR operation of data x and the immediate operand 128. The result is stored in $C_1$ of C-CMU. The specific operation method is as follows:

(11.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU simultaneously. The operand 128 is written in $B_1$.

(11.2) The first voltage $V_{CLEAR}$ is applied to the selection lines of $C_1$, $C_2$ and $C_3$ simultaneously. Therefore, $C_1$, $C_2$ and $C_3$ are in a state of high resistance.

(11.3) Through a communication network, B-CMU and C-CMU are connected. The second voltage $V_{COND}$ is applied to the selection line of $B_1$, and the third voltage $V_{SET}$ is applied to the selection line of $C_2$. Therefore, the implication operation of $C_2 \leftarrow B_1$ IMP $C_2$ is realized.

(11.4) The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(11.5) Through a communication network, A-CMU and C-CMU are connected. The second voltage $V_{COND}$ is applied to the selection line of $A_1$, and the third voltage $V_{SET}$ is applied to the selection line of $A_2$. Therefore, the implication operation of $C_3 \leftarrow A_1$ IMP $C_3$ is realized.

(11.6) The second voltage $V_{COND}$ is applied to the selection line of $A_2$, and the third voltage $V_{SET}$ is applied to the selection line of $C_1$. Therefore, the implication operation of $C_1 \leftarrow C_3$ IMP $C_1$ is realized.

(12) Immediate Operand XOR

Data x is stored in $A_1$ of A-CMU. The processor is adopted to realize the XOR operation of data x and the immediate operand 128. The result is stored in $C_1$ of C-CMU. The specific operation method is as follows:

(12.1) The third voltage $V_{SET}$ is applied to the selection line of a first memristor $B_{1,1}$ of a first set of memristors of a second integration unit B-CMU, and the first voltage $V_{CLEAR}$ is applied to the selection lines of $2^{nd}$-$8^{th}$ memristors $B_{1,2}$-$B_{1,8}$ of first set of memristors of a second integration unit B-CMU. The immediate operand 128 is written in $B_1$.

(12.2) The first voltage $V_{CLEAR}$ is applied to the selection lines of $C_1$, $C_2$, $C_3$, $D_1$ and $D_2$ simultaneously. Therefore, $C_1$, $C_2$, $C_3$, $D_1$ and $D_2$ are in a state of high resistance.

(12.3) Through a communication network, B-CMU and D-CMU are connected. The second voltage $V_{COND}$ is applied to the selection lines of $A_1$ and $B_1$ simultaneously, and the third voltage $V_{SET}$ is applied to the selection lines of $C_3$ and $D_2$ simultaneously. Therefore, the implication operation of $C_3 \leftarrow A_1$ IMP $C_3$ and $D_2 \leftarrow B_1$ IMP $D_2$ is realized.

(12.4) The second voltage $V_{COND}$ is applied to the selection lines of $C_3$ and $D_2$ simultaneously, and the third voltage $V_{SET}$ is applied to the selection lines of $C_2$ and $D_1$ simultaneously. Therefore, the implication operation of $C_2 \leftarrow C_3$ IMP $C_2$ and $D_2 \leftarrow D_1$ IMP $D_2$ is realized.

(12.5) Through a communication network, A-CMU and D-CMU are connected, and B-CMU and C-CMU are connected. The second voltage $V_{COND}$ is applied to the selection lines of $A_1$ and $B_1$ simultaneously, and the third voltage $V_{SET}$ is applied to the selection lines of $C_2$ and $D_1$ simultaneously. Therefore, the implication operation of $D_1 \leftarrow A_1$ IMP $D_1$ and $C_2 \leftarrow B_1$ IMP $C_2$ is realized.

(12.6) Through a communication network, B-CMU and C-CMU are connected. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(12.7) Through a communication network, C-CMU and D-CMU are connected. The second voltage $V_{COND}$ is applied to the selection line of $D_1$, and the third voltage $V_{SET}$ is applied to the selection line of $C_1$. Therefore, the implication operation of $C_1 \leftarrow D_1$ IMP $C_1$ is realized.

(13) Shift Left by m Bits

Data x is stored in $A_1$ of A-CMU. The processor is adopted to shift data x left by a single bit to be stored in $C_1$ of C-CMU. The specific operation method is as follows:

(13.1) The first voltage $V_{CLEAR}$ is applied to the selection lines of $C_1$ and $C_2$. Therefore, $C_1$ and $C_2$ are in a state of high resistance.

(13.2) Through a communication network, A-CMU and C-CMU are connected, and $A_{1,i+m}=C_{1,i}$. The switch $CK_1$ is turned off. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(13.3) The switch $CK_1$ is turned off. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

(14) Shift Right by m Bits

Data x is stored in $A_1$ of A-CMU. The processor is adopted to shift data x left by a single bit to be stored in $C_1$ of C-CMU. The specific operation method is as follows:

(14.1) The first voltage $V_{CLEAR}$ is applied to the selection lines of $C_1$ and $C_2$. Therefore, $C_1$ and $C_2$ are in a state of high resistance.

(14.2) Through a communication network, A-CMU and C-CMU are connected, and $A_{1,i}=C_{1,i+m}$. The switch $CK_1$ is turned off. The second voltage $V_{COND}$ is applied to the selection line of $A_1$, and the third voltage $V_{SET}$ is applied to the selection line of $C_2$. Therefore, the implication operation of $C_2 \leftarrow A_1$ IMP $C_2$ is realized.

(14.3) The switch $CK_1$ is turned off. The second voltage $V_{COND}$ is applied to the selection line of $C_2$, and the third voltage $V_{SET}$ is applied to the selection line of $C_1$. Therefore, the implication operation of $C_1 \leftarrow C_2$ IMP $C_1$ is realized.

Among them, $\Phi_\alpha$ represents the $\alpha^{th}$ set of memristors of Φ-CMU. For example, $A_1$ represents the first set of memristors of A-CMU; and $\Phi_{\lambda,\mu}$ represents the $\mu^{th}$ memristor of the $\lambda^{th}$ set of memristors of Φ-CMU. For example, $A_{1,1}$ represents the first memristor of the first set of memristors of A-CMU; and $\Phi K_\beta$ represents the $\beta^{th}$ horizontal line switch of Φ-CMU. For example, $AK_1$ represents the first horizontal line switch of A-CMU; and $\Phi K_{\gamma,\gamma+1}$ represents the $\gamma^{th}$ vertical line switch of Φ-CMU. For example, $AK_{1,2}$ represents the first horizontal line switch of A-CMU. If there is no special explanation, all horizontal lien switches are all turned on and all vertical line switches are turned off.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A processor, comprising:
   a computing and memory structure comprising X in number integration units and X in number communication units, the integration units being computing and memory units (CMUs), each computing and memory unit (CMU) being connected to one of the communication units, and the communication units being mutually connected to form a communication network; and
   a control unit, being configured to produce control signals according to commands, connect communication networks between the CMUs, choose operand addresses and result storage addresses, and search for one or a plurality of idle CMUs when extra CMUs are required for an operation;
   wherein
   each of the CMUs comprises M in number bit units and M−1 in number vertical line switches; the M in number bit units comprise M in number bit lines which are all connected to one of the communication units; and a vertical line switch, if exists, is arranged between bit line ends of two adjacent bit units;
   each bit unit comprises a resistor, a horizontal line switch and N in number memristors; one end of a first memristor serves as a first selection line and the other end of the first memristor is grounded via a horizontal line switch and a resistor in series; one end of a second memristor serves as a second selection line and the other end of the second memristor is connected to the other end of the first memristor; one end of a third memristor serves as a third selection line and the other end of the third memristor is connected to the other end of the second memristor . . . one end of an Nth memristor serves as an Nth selection line and the other end of the Nth memristor is connected to the other end of an N−1th memristor; and X is a positive integer greater than or equal to 2; M is a positive integer greater than or equal to 1; and N is a positive integer greater than or equal to 1.

2. The processor of claim 1, wherein a resistance value of a resistor in a bit unit is far greater than a resistance value of a memristor in a low-resistance state and far less than a resistance value of the memristor in a high-resistance state.

3. A method of data transmission of the processor of claim 1, comprising:

(1.1) applying a first voltage $V_{CLEAR}$ to selection lines of first set of memristors $B_1$ and second set of memristors $B_2$ in a second integration unit B-CMU; therefore, the memristors are in a state of high resistance, and the state of high resistance is marked as 0;

the first voltage $V_{CLEAR}$ is negative and greater than a first threshold voltage; the first threshold voltage is a voltage that changes the state of memristors;

(1.2) connecting a first integration unit A-CMU and the second integration unit B-CMU through a communication network; applying a second voltage VCOND to a selection line of a first set of memristors A1 of the first integration unit A-CMU, and applying a third voltage VSET to the selection line of the second set of memristors B2 of the second integration unit B-CMU, and storing ((NOT A1) OR B2) in the second set of memristors B2 to achieve implication operation;

the second voltage VCOND is positive and less than the threshold voltage; the third voltage VSET is positive and greater than the threshold voltage; a difference between the third voltage VSET and the second voltage VCOND is less than the threshold voltage; and (1.3) applying the second voltage VCOND to the selection line of the second set of memristors B2 in the second integration unit B-CMU; and applying the third voltage VSET to the first set of memristors B1 in the second integration unit B-CMU; storing data in the first set of memristors B1 to realize implication operation B1←B2 IMP B1 so as to transmit data x in the first set of memristors A1 in the first integration unit A-CMU into the first set of memristors B1 in the second integration unit B-CMU.

4. A method of data exchange of the processor of claim 1, comprising:

(2.1) applying a first voltage $V_{CLEAR}$ to selection lines of a first set of memristors $C_1$ and a second set of memristors $C_2$ of a third integration unit C-CMU, and to selection lines of a first set of memristors $D_1$ and a second set of memristors $D_2$ of a fourth integration unit D-CMU; therefore, $C_1$, $C_2$, $D_1$ and $D_2$ are in a state of high resistance and the state of high resistance is marked as 0;

(2.2) through a communication network, connecting a first integration unit A-CMU and the third integration unit C-CMU, and connecting a second integration unit B-CMU and the fourth integration unit D-CMU; applying a second voltage VCOND to selection lines of a first set of memristors A1 of the first integration unit A-CMU and a first set of memristors B1 of the second integration unit B-CMU simultaneously, and applying a third voltage VSET to the selection lines of a second set of memristors C2 of the third integration unit C-CMU and a second set of memristors D2 of the fourth integration unit D-CMU simultaneously; therefore, the implication operation of C2←A1 IMP C2 and D2←B1 IMP D2 is realized;

(2.3) applying the second voltage VCOND to selection lines of a second set of memristors C2 of the third integration unit C-CMU and a second set of memristors D2 of the fourth integration unit D-CMU simultaneously, and applying the third voltage VSET to the selection lines of a first set of memristors C1 of the third integration unit C-CMU and a first set of memristors D1 of the fourth integration unit D-CMU simultaneously; therefore, the implication operation of C1←C2 IMP C1 and D1←D2 IMP D1 is realized;

(2.4) applying the first voltage VCLEAR to the selection lines of a first set of memristors A1 of the first integration unit A-CMU, a second set of memristors A2 of the first integration unit A-CMU, a first set of memristors B1 of the second integration unit B-CMU and a second set of memristors B2 of the second integration unit B-CMU simultaneously; therefore, a first set of memristors A1 of the first integration unit A-CMU, a second set of memristors A2 of the first integration unit A-CMU, a first set of memristors B1 of the second integration unit B-CMU and a second set of memristors B2 of the second integration unit B-CMU are in a state of high resistance;

(2.5) through a communication network, connecting a first integration unit A-CMU and a fourth integration unit D-CMU, and connecting a second integration unit B-CMU and third integration unit C-CMU; applying the second voltage VCOND to the a first set of memristors C1 of the third integration unit C-CMU and a first set of memristors D1 of the fourth integration unit D-CMU simultaneously, and applying the third voltage VSET to the selection lines of a second set of memristors A2 of the first integration unit A-CMU and a second set of memristors B2 of the second integration unit B-CMU simultaneously; therefore, the implication operation of A2←D1 IMP A2 and B2←C1 IMP B2 is realized;

(2.6) applying the second voltage VCOND to the selection lines of a second set of memristors A2 of the first integration unit A-CMU and a second set of memristors B2 of the second integration unit B-CMU simultaneously, and applying the third voltage VSET to the selection lines of a first set of memristors A1 of the first integration unit A-CMU and a first set of memristors B1 of the second integration unit B-CMU simultaneously; therefore, the implication operation of A1←A2 IMP A1 and B1←B2 IMP B1 is realized, data x is stored in B1 of a second integration unit B-CMU and data y is stored in a first set of memristors A1 of the first integration unit A-CMU.

5. A method of addition operation of the processor of claim 1, comprising:

(3.1) applying a first voltage $V_{CLEAR}$ to selection lines of a second set of memristors $C_2$ of the third integration unit C-CMU, a first set of memristors $G_1$ of the seventh integration unit G-CMU, a second set of memristors G2 of the seventh integration unit G-CMU, a second set of memristors $D_2$ of the fourth integration unit D-CMU and a first set of memristors $H_1$ of the eighth integration unit H-CMU; therefore, $C_2$, $G_1$, $G_2$, $D_2$ and $H_1$ are in a state of high resistance;

(3.2) through a communication network, connecting a first integration unit A-CMU and a seventh integration unit G-CMU, and connecting a second integration unit B-CMU and an eighth integration unit H-CMU; applying a second voltage VCOND to selection lines of a first set of memristors A1 of the first integration unit A-CMU and a first set of memristors B1 of the second integration unit B-CMU simultaneously, and applying a third voltage VSET to the selection lines of a first set of memristors G1 of the seventh integration unit G-CMU and a first set of memristors H1 of the eighth integration unit H-CMU simultaneously; therefore, the implication operation of G1←A1 IMP G1 and H1←B1 IMP H1 is realized;

(3.3) through a communication network, connecting a third integration unit C-CMU and a seventh integration unit G-CMU, and connecting a fourth integration unit D-CMU and an eighth integration unit H-CMU; applying the second voltage VCOND to the selection lines of a first set of memristors G1 of the seventh integration unit G-CMU and a first set of memristors H1 of the eighth integration unit H-CMU simultaneously, and applying the third voltage VSET to the selection lines of a second set of memristors C2 of the third integration unit C-CMU and a second set of memristors D2 of the fourth integration unit D-CMU simultaneously; therefore, the implication operation of C2←G1 IMP C2 and D2←H1 IMP D2 is realized;

(3.4) through a communication network, connecting a first integration unit A-CMU and a fourth integration unit D-CMU, and connecting a second integration unit B-CMU and a third integration unit C-CMU; applying the second voltage VCOND to the selection lines of a first set of memristors A1 of the first integration unit A-CMU and a first set of memristors B1 of the second integration unit B-CMU simultaneously, and applying the third voltage VSET to the selection lines of a second set of memristors C2 of the third integration unit C-CMU and a second set of memristors D2 of the fourth integration unit D-CMU simultaneously; therefore, the implication operation of D2←A1 IMP D2 and C2←B1 IMP C2 is realized;

(3.5) through a communication network, connecting a third integration unit C-CMU and a seventh integration unit G-CMU; applying the second voltage VCOND to the selection line of a second set of memristors C2 of the third integration unit C-CMU, and applying the third voltage VSET to the selection line of G2; therefore, the implication operation of G2←C2 IMP G2 is realized;

(3.6) through a communication network, connecting a fourth integration unit D-CMU and a seventh integration unit G-CMU; applying the second voltage VCOND to the selection line of a second set of memristors D2 of the fourth integration unit D-CMU, and applying the third voltage VSET to the selection line of G2; therefore, the implication operation of G2←D2 IMP G2 is realized;

(3.7) applying the first voltage VCLEAR to the selection lines of an ith memristor B2, i of the second set of memristors of the second integration unit B-CMU, an ith memristor D2, i of the second set of memristors of the fourth integration unit D-CMU, and an (i+1)th memristor H2, i+1 of the second set of memristors of the eighth integration unit H-CMU simultaneously; therefore, B2, i, D2, i and H2, i+1 are in a state of high resistance, initially, i=1;

(3.8) through a communication network, connecting a fourth integration unit D-CMU and a seventh integration unit G-CMU; applying the second voltage VCOND to the selection lines of B1, i and G2, i, and applying the third voltage VSET to the selection lines of an ith memristor B2, i of the second set of memristors B2 of the second integration unit B-CMU and an ith memristor D2, i of the second set of memristors of the fourth integration unit D-CMU; therefore, the implication operation of B2, i←B1, i IMP B2, i and D2, i←G2, i IMP D2, i is realized;

(3.9) through a communication network, connecting a first integration unit A-CMU and a second integration unit B-CMU, and connecting a fourth integration unit D-CMU and an eighth integration unit H-CMU; applying the second voltage VCOND to the selection lines of A1, i and H2, i, and applying the third voltage VSET to the selection lines of an ith memristor B2, i of the second set of memristors B2 of the second integration unit B-CMU and an ith memristor D2, i of the second set of memristors of the fourth integration unit D-CMU; therefore, the implication operation of B2, i←A1, i IMP B2, i and D2, i←H2, i IMP D2, i is realized;

(3.10) through a communication network, connecting a fourth integration unit D-CMU and an eighth integration unit H-CMU; the switch DKi is turned off, and the switch DKi, i+1 is turned on; applying the second voltage VCOND to the selection line of an ith memristor D2, i of the second set of memristors of the fourth integration unit D-CMU, and applying the third voltage VSET to the selection line of H2, i+1; therefore, the implication operation of H2, i+1←D2, i IMP H2, i+1 is realized;

(3.11) through a communication network, connecting a second integration unit B-CMU and an eighth integration unit H-CMU; switches BKi, HKi, HKi+1 and BKi, i+1 are turned off, and the switch HKi, i+1 is turned on; applying the second voltage VCOND to the selection line of an ith memristor B2, i of the second set of memristors B2 of the second integration unit B-CMU, and applying the third voltage VSET to the selection line of H2, i+1; therefore, the implication operation of H2, i+1←B2, i IMP H2, i+1 is realized;

(3.12) determining if i is less than 8, execute i+1 and returns to 3.7; if i≥8, execute following steps;

(3.13) applying the first voltage VCLEAR to the selection lines of a second set of memristors A2 of the first integration unit A-CMU, E1, a second set of memristors B2 of the second integration unit B-CMU, F1 and a first set of memristors C1 of the third integration unit C-CMU simultaneously; therefore, a second set of memristors A2 of the first integration unit A-CMU, E1, a second set of memristors B2 of the second integration unit B-CMU, F1 and a first set of memristors C1 of the third integration unit C-CMU are in a state of high resistance;

(3.14) through a communication network, connecting a fifth integration unit E-CMU and a seventh integration unit G-CMU, and connecting a sixth integration unit F-CMU and an eighth integration unit H-CMU; applying the second voltage VCOND to the selection lines of G2 and H2, and applying the third voltage VSET to the selection lines of E1 and F1; therefore, the implication operation of E1←G2 IMP E1 and F1←H2 IMP F1 is realized;

(3.15) through a communication network, connecting a first integration unit A-CMU and a fifth integration unit E-CMU, and connecting a second integration unit B-CMU and an eighth integration unit H-CMU; applying the second voltage VCOND to the selection lines of E1 and F1, and applying the third voltage VSET to the selection lines of a second set of memristors A2 of the first integration unit A-CMU and a second set of memristors B2 of the second integration unit B-CMU; therefore, the implication operation of A2←E1 IMP A2 and B2←F1 IMP B2 is realized;

(3.16) through a communication network, connecting a first integration unit A-CMU and an eighth integration unit H-CMU, and connecting a second integration unit B-CMU and a seventh integration unit G-CMU; applying the second voltage VCOND to the selection lines of H2 and G2, and applying the third voltage VSET to the selection lines of a second set of memristors A2 of the first integration unit A-CMU and a second set of memristors B2 of the second integration unit B-CMU; therefore, the implication operation of A2←H2 IMP A2 and B2←G2 IMP B2 is realized;

(3.17) through a communication network, connecting a first integration unit A-CMU and a third integration unit C-CMU; applying the second voltage VCOND to the selection line of a second set of memristors A2 of the first integration unit A-CMU, and applying the third voltage VSET to the selection line of a first set of memristors C1 of the third integration unit C-CMU; therefore, the implication operation of C1←A2 IMP C1 is realized;

(3.18) through a communication network, connecting a second integration unit B-CMU and a third integration unit C-CMU; applying the second voltage VCOND to the selection line of a second set of memristors B2 of the second integration unit B-CMU, and applying the third voltage VSET to the selection line of a first set of memristors C1 of the third integration unit C-CMU; therefore, the implication operation of C1←B2 IMP C1 is realized, so as to add data X in the first set of memristors A1 in the first integration unit A-CMU to data Y in the first set of memristors B1 in the second integration unit a second integration unit B-CMU, and store in C1 of a third integration unit C-CMU.

6. A method of immediate operand addition of the processor of claim 1, the immediate operand being 128, the method comprising:

(4.1) applying the voltage $V_{SET}$ to the selection line of a first memristor $B_{1,\ 1}$ of a first set of memristors of a second integration unit B-CMU, and applying the voltage $V_{CLEAR}$ to the selection lines of $2^{nd}$-$8^{th}$ memristors $B_{1,\ 2}$-$B_{1,\ 8}$ of a first set of memristors of a second integration unit B-CMU, the immediate operand 128 is written in a first set of memristors $B_1$ of the second integration unit B-CMU;

(4.2) applying a first voltage VCLEAR to the selection lines of a second set of memristors C2 of the third integration unit C-CMU, a first set of memristors G1 of the seventh integration unit G-CMU, a second set of memristors G2 of the seventh integration unit G-CMU, a second set of memristors D2 of the fourth integration unit D-CMU and a first set of memristors H1 of the eighth integration unit H-CMU; therefore, C2, G1, G2, D2 and H1 are in a state of high resistance;

(4.3) through a communication network, connecting a first integration unit A-CMU and a seventh integration unit G-CMU, and connecting a second integration unit B-CMU and an eighth integration unit H-CMU; applying a second voltage VCOND to the selection lines of A1 and a first set of memristors B1 of the second integration unit B-CMU simultaneously, and applying a third voltage VSET to the selection lines of a first set of memristors G1 of the seventh integration unit G-CMU and a first set of memristors H1 of the eighth integration unit H-CMU simultaneously; therefore, the implication operation of G1←A1 IMP G1 and H1←B1 IMP H1 is realized;

(4.4) through a communication network, connecting a third integration unit C-CMU and a seventh integration unit G-CMU, and connecting a fourth integration unit D-CMU and an eighth integration unit H-CMU; applying the second voltage VCOND to the selection lines of a first set of memristors G1 of the seventh integration unit G-CMU and a first set of memristors H1 of the eighth integration unit H-CMU simultaneously, and applying the third voltage VSET to the selection lines of a second set of memristors C2 of the third integration unit C-CMU and a second set of memristors D2 of the fourth integration unit D-CMU simultaneously; therefore, the implication operation of C2←G1 IMP C2 and D2←H1 IMP D2 is realized;

(4.5) through a communication network, connecting a first integration unit A-CMU and a fourth integration unit D-CMU, and connecting a second integration unit B-CMU and a third integration unit C-CMU; applying the second voltage VCOND to the selection lines of a first set of memristors A1 of the first integration unit A-CMU and a first set of memristors B1 of the second integration unit B-CMU simultaneously, and applying the third voltage VSET to the selection lines of a second set of memristors C2 of the third integration unit C-CMU and a second set of memristors D2 of the fourth integration unit D-CMU simultaneously; therefore, the implication operation of D2←A1 IMP D2 and C2←B1 IMP C2 is realized;

(4.6) through a communication network, connecting a third integration unit C-CMU and a seventh integration unit G-CMU; applying the second voltage VCOND to the selection line of a second set of memristors C2 of the third integration unit C-CMU, and applying the third voltage VSET to the selection line of G2; therefore, the implication operation of G2←C2 IMP G2 is realized;

(4.7) through a communication network, connecting a fourth integration unit D-CMU and a seventh integration unit G-CMU; applying the second voltage VCOND to the selection line of a second set of memristors D2 of the fourth integration unit D-CMU, and applying the third voltage VSET to the selection line of G2; therefore, the implication operation of G2←D2 IMP G2 is realized;

(4.8) applying the first voltage VCLEAR to the selection lines of an ith memristor B2, i of the second set of memristors B2 of the second integration unit B-CMU, an ith memristor D2, i of the second set of memristors of the fourth integration unit D-CMU and an (i+1)th memristor H2, i+1 of the second set of memristors of the eighth integration unit H-CMU simultaneously; therefore, B2, i, D2, i and H2, i+1 are in a state of high resistance, initially, i=1;

(4.9) through a communication network, connecting a fourth integration unit D-CMU and a seventh integration unit G-CMU; applying the second voltage VCOND to the selection lines of B1, i and G2, i, and applying the third voltage VSET to the selection lines of an ith memristor B2, i of the second set of memristors B2 of the second integration unit B-CMU and an ith memristor D2, i of the second set of memristors of the fourth integration unit D-CMU; therefore, the implication operation of B2, i←B1, i IMP B2, i and D2, i←G2, i IMP D2, i is realized;

(4.10) through a communication network, connecting a first integration unit A-CMU and a second integration unit B-CMU, and connecting a fourth integration unit D-CMU and an eighth integration unit H-CMU; applying the second voltage VCOND to the selection lines of A1, i and H2, i, and applying the third voltage VSET to the selection lines of an ith memristor B2, i of the second set of memristors B2 of the second integration unit B-CMU and an ith memristor D2, i of the second set of memristors of the fourth integration unit D-CMU; therefore, the implication operation of B2, i←A1, i IMP B2, i and D2, i←H2, i IMP D2, i is realized;

(4.11) through a communication network, connecting a fourth integration unit D-CMU and an eighth integration unit H-CMU; the switch DKi is turned off, and the switch DKi, i+1 is turned on; applying the second voltage VCOND to the selection line of an ith memristor D2, i of the second set of memristors of the fourth integration unit D-CMU, and applying the third voltage VSET to the selection line of H2, i+1; therefore, the implication operation of H2, i+1←D2, i IMP H2, i+1 is realized;

(4.12) through a communication network, connecting a second integration unit B-CMU and an eighth integration unit H-CMU; switches BKi, HKi, HKi+1 and BKi, i+1 are turned off, and the switch HKi, i+1 is turned on; applying the second voltage VCOND to the selection line of an ith memristor B2, i of the second set of memristors B2 of the second integration unit B-CMU, and applying the third voltage VSET to the selection line of H2, i+1; therefore, the implication operation of H2, i+1←B2, i IMP H2, i+1 is realized;

(4.13) if i is less than 8, execute i+1 and return to (4.8); if i≥8, execute following steps;

(4.14) applying the first voltage VCLEAR to the selection lines of a second set of memristors A2 of the first integration unit A-CMU, E1, B2, F1 and a first set of memristors C1 of the third integration unit C-CMU simultaneously; therefore, a second set of memristors A2 of the first integration unit A-CMU, E1, B2, F1 and a first set of memristors C1 of the third integration unit C-CMU are in a state of high resistance;

(4.15) through a communication network, connecting a fifth integration unit E-CMU and a seventh integration unit G-CMU, and connecting a sixth integration unit F-CMU and an eighth integration unit H-CMU; applying the second voltage VCOND to the selection lines of G2 and H2, and applying the third voltage VSET to the selection lines of E1 and F1; therefore, the implication operation of E1←G2 IMP E1 and F1←H2 IMP F1 is realized;

(4.16) through a communication network, connecting a first integration unit A-CMU and a fifth integration unit E-CMU, and connecting a second integration unit B-CMU and an eighth integration unit H-CMU; applying the second voltage VCOND to the selection lines of E1 and F12, and applying the third voltage VSET to the selection lines of a second set of memristors A2 of the first integration unit A-CMU and a second set of memristors B2 of the second integration unit B-CMU; therefore, the implication operation of A2←E1 IMP A2 and B2←F1 IMP B2 is realized;

(4.17) through a communication network, connecting a first integration unit A-CMU and an eighth integration unit H-CMU, and connecting a second integration unit B-CMU and a seventh integration unit G-CMU; applying the second voltage VCOND to the selection lines of H2 and G2, and applying the third voltage VSET to the selection lines of a second set of memristors A2 of the first integration unit A-CMU and a second set of memristors B2 of the second integration unit B-CMU; therefore, the implication operation of A2←H2 IMP A2 and B2←G2 IMP B2 is realized;

(4.18) through a communication network, connecting a first integration unit A-CMU and a third integration unit C-CMU; applying the second voltage VCOND to the selection line of a second set of memristors A2 of the first integration unit A-CMU, and applying the third voltage VSET to the selection line of a first set of memristors C1 of the third integration unit C-CMU; therefore, the implication operation of C1←A2 IMP C1 is realized;

(4.19) through a communication network, connecting a second integration unit B-CMU and a third integration unit C-CMU; applying the second voltage VCOND to the selection line of a second set of memristors B2 of the second integration unit B-CMU, and applying the third voltage VSET to the selection line of a first set of memristors C1 of the third integration unit C-CMU; therefore, the implication operation of C1←B2 IMP C1 is realized.

7. A method of logic AND of the processor of claim 1, comprising:

(5.1) applying a first voltage $V_{CLEAR}$ to the selection lines of a first set of memristors $C_1$ of the third integration unit C-CMU and a second set of memristors $C_2$ of the third integration unit C-CMU simultaneously; a first set of memristors $C_1$ of the third integration unit C-CMU and a second set of memristors $C_2$ of the third integration unit C-CMU are in a state of high resistance;

(5.2) through a communication network, connecting a second integration unit B-CMU and a third integration unit C-CMU; applying a second voltage VCOND to the selection line of a first set of memristors B1 of the second integration unit B-CMU, and applying a third voltage VSET to the selection line of a second set of memristors C2 of the third integration unit C-CMU; therefore, the implication operation of C2←B1 IMP C2 is realized;

(5.3) through a communication network, connecting a first integration unit A-CMU and a third integration unit C-CMU; applying the second voltage VCOND to the selection line of a first set of memristors A1 of the first integration unit A-CMU, and applying the third voltage VSET to the selection line of a second set of memristors C2 of the third integration unit C-CMU; therefore, the implication operation of C2←A1 IMP C2 is realized; and (5.4) applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized.

8. A method of logic OR of the processor of claim 1, comprising:
- (6.1) applying a first voltage $V_{CLEAR}$ to the selection lines of a first set of memristors $C_1$ of the third integration unit C-CMU, a second set of memristors $C_2$ of the third integration unit C-CMU and a second set of memristors $A_2$ of the first integration unit A-CMU simultaneously; therefore, a first set of memristors $C_1$ of the third integration unit C-CMU, a second set of memristors $C_2$ of the third integration unit C-CMU and a second set of memristors $A_2$ of the first integration unit A-CMU are in a state of high resistance;
- (6.2) through a communication network, connecting a second integration unit B-CMU and a third integration unit C-CMU; applying a second voltage VCOND to the selection line of a first set of memristors B1 of the second integration unit B-CMU, and applying a third voltage VSET to the selection line of a second set of memristors C2 of the third integration unit C-CMU; therefore, the implication operation of C2←B1 IMP C2 is realized;
- (6.3) applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized;
- (6.4) applying the second voltage VCOND to the selection line of A1, and applying the third voltage VSET to the selection line of a second set of memristors A2 of the first integration unit A-CMU; therefore, the implication operation of A2←A1 IMP A2 is realized; and
- (6.5) through a communication network, connecting a first integration unit A-CMU and a third integration unit C-CMU; applying the second voltage VCOND to the selection line of a second set of memristors A2 of the first integration unit A-CMU, and applying the third voltage VSET to the selection line of a first set of memristors C1 of the third integration unit C-CMU; therefore, the implication operation of C1←A2 IMP C1 is realized.

9. A method of logic NOT of the processor of claim 1, comprising:
- (7.1) applying a first voltage $V_{CLEAR}$ to the selection line of a second set of memristors $A_2$ of the first integration unit A-CMU; therefore, a second set of memristors $A_2$ of the first integration unit A-CMU is in a state of high resistance; and
- (7.2) applying a second voltage VCOND to the selection line of a first set of memristors A1 of the first integration unit A-CMU, and applying a third voltage VSET to the selection line of a second set of memristors A2 of the first integration unit A-CMU; therefore, the implication operation A2←A1 IMP A2 is realized.

10. A method of logic XOR of the processor of claim 1, comprising:
- (8.1) applying a first voltage $V_{CLEAR}$ to the selection lines of a first set of memristors $C_1$ of the third integration unit C-CMU, a second set of memristors $C_2$ of the third integration unit C-CMU, a second set of memristors $A_2$ of the first integration unit A-CMU, $D_1$ and a second set of memristors $D_2$ of the fourth integration unit D-CMU simultaneously; therefore, a first set of memristors $C_1$ of the third integration unit C-CMU, a second set of memristors $C_2$ of the third integration unit C-CMU, a second set of memristors $A_2$ of the first integration unit A-CMU, $D_1$ and $D_2$ are in a state of high resistance;
- (8.2) through a communication network, connecting a second integration unit B-CMU and a fourth integration unit D-CMU; applying a second voltage VCOND to the selection lines of A1 and a first set of memristors B1 of the second integration unit B-CMU simultaneously, and applying a third voltage VSET to the selection lines of a second set of memristors A2 of the first integration unit A-CMU and a second set of memristors D2 of the fourth integration unit D-CMU simultaneously; therefore, the implication operation of A2←A1 IMP A2 and D2←B1 IMP D2 is realized;
- (8.3) through a communication network, connecting a first integration unit A-CMU and a third integration unit C-CMU; applying the second voltage VCOND to the selection lines of a second set of memristors A2 of the first integration unit A-CMU and a second set of memristors D2 of the fourth integration unit D-CMU simultaneously, and applying the third voltage VSET to the selection lines of a second set of memristors C2 of the third integration unit C-CMU and D1 simultaneously; therefore, the implication operation of C2←A2 IMP C2 and D2←D1 IMP D2 is realized;
- (8.4) through a communication network, connecting a first integration unit A-CMU and a fourth integration unit D-CMU, and connecting a second integration unit B-CMU and a third integration unit C-CMU; applying the second voltage VCOND to the selection lines of a first set of memristors A1 of the first integration unit A-CMU and a first set of memristors B1 of the second integration unit B-CMU simultaneously, and applying the third voltage VSET to the selection lines of a second set of memristors C2 of the third integration unit C-CMU and D1 simultaneously; therefore, the implication operation of D1←A1 IMP D1 and C2←B1 IMP C2 is realized;
- (8.5) through a communication network, connecting a second integration unit B-CMU and a third integration unit C-CMU; applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized;
- (8.6) through a communication network, connecting a third integration unit C-CMU and a fourth integration unit D-CMU; applying the second voltage VCOND to the selection line of D1, and applying the third voltage VSET to the selection line of a first set of memristors C1 of the third integration unit C-CMU; therefore, the implication operation of C1←D1 IMP C1 is realized.

11. A method of logic XOR of the processor of claim 1, comprising:
- (9.1) applying a first voltage $V_{CLEAR}$ to the selection lines of a first set of memristors $C_1$ of the third integration unit C-CMU, a second set of memristors $C_2$ of the third integration unit C-CMU, a second set of memristors $A_2$ of the first integration unit A-CMU and a second set of memristors $B_2$ of the second integration unit B-CMU simultaneously; therefore, a first set of memristors $C_1$ of the third integration unit C-CMU, a second set of memristors $C_2$ of the third integration unit C-CMU, a second set of memristors $A_2$ of the first integration unit A-CMU and a second set of memristors $B_2$ of the second integration unit B-CMU are in a state of high resistance;

(9.2) through a communication network, connecting a second integration unit B-CMU and a third integration unit C-CMU; applying a second voltage VCOND to the selection line of a first set of memristors B1 of the second integration unit B-CMU, and applying a third voltage VSET to the selection line of a second set of memristors C2 of the third integration unit C-CMU; therefore, the implication operation of C2←B1 IMP C2 is realized;

(9.3) through a communication network, connecting a second integration unit B-CMU and a third integration unit C-CMU; applying the second voltage VCOND to the selection line of a second set of memristors C2 of the third integration unit C-CMU, and applying the third voltage VSET to the selection line of a second set of memristors B2 of the second integration unit B-CMU; therefore, the implication operation of B2←C2 IMP B2 is realized;

(9.4) applying the second voltage VCOND to the selection line of A1, and applying the third voltage VSET to the selection line of a second set of memristors A2 of the first integration unit A-CMU; therefore, the implication operation of A2←A1 IMP A2 is realized;

(9.5) through a communication network, connecting a first integration unit A-CMU and a second integration unit B-CMU; applying the second voltage VCOND to the selection line of a second set of memristors A2 of the first integration unit A-CMU, and applying the third voltage VSET to the selection line of a second set of memristors B2 of the second integration unit B-CMU; therefore, the implication operation of B2←A2 IMP B2 is realized;

(9.6) through a communication network, connecting a second integration unit B-CMU and a third integration unit C-CMU; applying the second voltage VCOND to the selection line of a second set of memristors B2 of the second integration unit B-CMU, and applying the third voltage VSET to the selection line of a first set of memristors C1 of the third integration unit C-CMU; therefore, the implication operation of C1←B2 IMP C1 is realized.

12. A method of immediate operand AND of the processor of claim 1, the immediate operand being 128, the method comprising:

(10.1) applying a third voltage $V_{SET}$ to the selection line of a first memristor $B_{1,1}$ of first set of memristors of a second integration unit B-CMU, and applying a first voltage $V_{CLEAR}$ to the selection lines of $2^{nd}$-$8^{th}$ memristors $B_{1,2}$-$B_{1,8}$ of first set of memristors of a second integration unit B-CMU simultaneously; the operand 128 is written in a first set of memristors $B_1$ of the second integration unit B-CMU;

(10.2) applying the first voltage VCLEAR to the selection lines of a first set of memristors C1 of the third integration unit C-CMU and a second set of memristors C2 of the third integration unit C-CMU; therefore, a first set of memristors C1 of the third integration unit C-CMU and a second set of memristors C2 of the third integration unit C-CMU are in a state of high resistance;

(10.3) through a communication network, connecting a second integration unit B-CMU and a third integration unit C-CMU; applying a second voltage VCOND to the selection line of a first set of memristors B1 of the second integration unit B-CMU, and applying the third voltage VSET to the selection line of a second set of memristors C2 of the third integration unit C-CMU; therefore, the implication operation of C2←B1 IMP C2 is realized;

(10.4) through a communication network, connecting a first integration unit A-CMU and a third integration unit C-CMU; applying the second voltage VCOND to the selection line of a first set of memristors A1 of the first integration unit A-CMU, and applying the third voltage VSET to the selection line of a second set of memristors C2 of the third integration unit C-CMU; therefore, the implication operation of C2←A1 IMP C2 is realized;

(10.5) applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized.

13. A method of immediate operand OR of the processor of claim 1, the immediate operand being 128, and the method comprising:

(11.1) applying a third voltage $V_{SET}$ to the selection line of a first memristor $B_{1,1}$ of first set of memristors of a second integration unit B-CMU, and applying a first voltage $V_{CLEAR}$ to the selection lines of $2^{nd}$-$8^{th}$ memristors $B_{1,2}$-$B_{1,8}$ of first set of memristors of a second integration unit B-CMU simultaneously; the operand 128 is written in a first set of memristors $B_1$ of the second integration unit B-CMU;

(11.2) applying the first voltage VCLEAR to the selection lines of a first set of memristors C1 of the third integration unit C-CMU, a second set of memristors C2 of the third integration unit C-CMU and a second set of memristors A2 of the first integration unit A-CMU simultaneously; therefore, a first set of memristors C1 of the third integration unit C-CMU, a second set of memristors C2 of the third integration unit C-CMU and a second set of memristors A2 of the first integration unit A-CMU are in a state of high resistance;

(11.3) through a communication network, connecting a second integration unit B-CMU and a third integration unit C-CMU; applying a second voltage VCOND to the selection line of a first set of memristors B1 of the second integration unit B-CMU, and applying the third voltage VSET to the selection line of a second set of memristors C2 of the third integration unit C-CMU; therefore, the implication operation of C2←B1 IMP C2 is realized;

(11.4) applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized;

(11.5) applying the second voltage VCOND to the selection line of a first set of memristors A1 of the first integration unit A-CMU, and applying the third voltage VSET to the selection line of a second set of memristors A2 of the first integration unit A-CMU; therefore, the implication operation of A2←A1 IMP A2 is realized;

(11.6) through a communication network, connecting a first integration unit A-CMU and a third integration unit C-CMU; applying the second voltage VCOND to the selection line of a second set of memristors A2 of the first integration unit A-CMU, and applying the third voltage VSET to the selection line of a first set of memristors C1 of the third integration unit C-CMU; therefore, the implication operation of C1←A2 IMP C1 is realized.

14. A method of immediate operand XOR of the processor of claim 1, the immediate operand being 128, and the method comprising:

(12.1) applying a third voltage $V_{SET}$ to the selection line of a first memristor $B_{1,1}$ of first set of memristors of a second integration unit B-CMU, and applying a first voltage $V_{CLEAR}$ to the selection lines of $2^{nd}$-$8^{th}$ memristors $B_{1,2}$-$B_{1,8}$ of first set of memristors of a second integration unit B-CMU; the immediate operand 128 is written in a first set of memristors $B_1$ of the second integration unit B-CMU;

(12.2) applying the first voltage VCLEAR to the selection lines of a first set of memristors C1 of the third integration unit C-CMU, a second set of memristors C2 of the third integration unit C-CMU, a second set of memristors A2 of the first integration unit A-CMU, D1 and a second set of memristors D2 of the fourth integration unit D-CMU simultaneously; therefore, a first set of memristors C1 of the third integration unit C-CMU, a second set of memristors C2 of the third integration unit C-CMU, a second set of memristors A2 of the first integration unit A-CMU, D1 and D2 are in a state of high resistance;

(12.3) through a communication network, connecting a second integration unit B-CMU and a fourth integration unit D-CMU; applying a second voltage VCOND to the selection lines of A1 and a first set of memristors B1 of the second integration unit B-CMU simultaneously, and applying the third voltage VSET to the selection lines of a second set of memristors A2 of the first integration unit A-CMU and a second set of memristors D2 of the fourth integration unit D-CMU simultaneously; therefore, the implication operation of A2←A1 IMP A2 and D2←B1 IMP D2 is realized;

(12.4) through a communication network, connecting a first integration unit A-CMU and a third integration unit C-CMU; applying the second voltage VCOND to the selection lines of a second set of memristors A2 of the first integration unit A-CMU and a second set of memristors D2 of the fourth integration unit D-CMU simultaneously, and applying the third voltage VSET to the selection lines of a second set of memristors C2 of the third integration unit C-CMU and D1 simultaneously; therefore, the implication operation of C2←A2 IMP C2 and D2←D1 IMP D2 is realized;

(12.5) through a communication network, connecting a first integration unit A-CMU and a fourth integration unit D-CMU, and connecting a second integration unit B-CMU and a third integration unit C-CMU; applying the second voltage VCOND to the selection lines of a first set of memristors A1 of the first integration unit A-CMU and a first set of memristors B1 of the second integration unit B-CMU simultaneously, and applying the third voltage VSET to the selection lines of a second set of memristors C2 of the third integration unit C-CMU and D1 simultaneously; therefore, the implication operation of D1←A1 IMP D1 and C2←B1 IMP C2 is realized;

(12.6) through a communication network, connecting a second integration unit B-CMU and a third integration unit C-CMU; applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized; and (12.7) through a communication network, connecting a third integration unit C-CMU and a fourth integration unit D-CMU; applying the second voltage VCOND to the selection line of D1, and applying the third voltage VSET to the selection line of a first set of memristors C1 of the third integration unit C-CMU; therefore, the implication operation of C1←D1 IMP C1 is realized.

15. A method of shift left by m Bits of the processor of claim 1, the method comprising:

(13.1) applying a first voltage $V_{CLEAR}$ to the selection lines of a first set of memristors $C_1$ of the third integration unit C-CMU and a second set of memristors $C_2$ of the third integration unit C-CMU; therefore, a first set of memristors $C_1$ of the third integration unit C-CMU and a second set of memristors $C_2$ of the third integration unit C-CMU are in a state of high resistance;

(13.2) through a communication network, connecting a first integration unit A-CMU and a third integration unit C-CMU, and A1, i+m=C1, i; the switch CK1 is turned off; applying a second voltage VCOND to the selection line of a first set of memristors A1 of the first integration unit A-CMU, and applying a third voltage VSET to the selection line of a second set of memristors C2 of the third integration unit C-CMU; therefore, the implication operation of C2←A1 IMP C2 is realized; and (13.3) the switch CK1 is turned off; applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized.

16. A method of shift left by m Bits of the processor of claim 1, the method comprising:

(14.1) applying a first voltage $V_{CLEAR}$ to the selection lines of a first set of memristors $C_1$ of the third integration unit C-CMU and a second set of memristors $C_2$ of the third integration unit C-CMU; therefore, a first set of memristors $C_1$ of the third integration unit C-CMU and a second set of memristors $C_2$ of the third integration unit C-CMU are in a state of high resistance;

(14.2) through a communication network, connecting a first integration unit A-CMU and a third integration unit C-CMU, and A1, i+m=C1, i; the switch CK1 is turned off; applying a second voltage VCOND to the selection line of a first set of memristors A1 of the first integration unit A-CMU, and applying a third voltage VSET to the selection line of a second set of memristors C2 of the third integration unit C-CMU; therefore, the implication operation of C2←A1 IMP C2 is realized; and (14.3) the switch CK1 is turned off; applying the second voltage VCOND to the selection line of a second set of memristors C2 of the third integration unit C-CMU, and applying the third voltage VSET to the selection line of a first set of memristors C1 of the third integration unit C-CMU; therefore, the implication operation of C1←C2 IMP C1 is realized.

* * * * *